(12) United States Patent
Chao et al.

(10) Patent No.: US 12,206,409 B2
(45) Date of Patent: Jan. 21, 2025

(54) FLOATING VOLTAGE SUPPRESSION IN HIGH SPEED MULTIPLEXERS

(71) Applicant: PARADE TECHNOLOGIES, LTD, San Jose, CA (US)

(72) Inventors: Chieh-Yuan Chao, Fremont, CA (US); Jenghung Tsai, Santa Clara, CA (US)

(73) Assignee: PARADE TECHNOLOGIES, LTD, San Jose, CA (US)

( * ) Notice: Subject to any disclaimer, the term of this patent is extended or adjusted under 35 U.S.C. 154(b) by 128 days.

(21) Appl. No.: 18/182,996

(22) Filed: Mar. 13, 2023

(65) Prior Publication Data
US 2024/0313780 A1    Sep. 19, 2024

(51) Int. Cl.
| H03K 19/173 | (2006.01) |
| H03K 17/693 | (2006.01) |
| H03K 19/003 | (2006.01) |
| H03K 19/1776 | (2020.01) |

(52) U.S. Cl.
CPC ....... *H03K 19/1737* (2013.01); *H03K 17/693* (2013.01); *H03K 19/00361* (2013.01); *H03K 19/1776* (2013.01)

(58) Field of Classification Search
None
See application file for complete search history.

(56) References Cited

U.S. PATENT DOCUMENTS

| 2005/0225359 A1* | 10/2005 | Campbell | ............ | H03K 17/693 |
| | | | | 326/105 |
| 2017/0276729 A1* | 9/2017 | Kim | ............... | G01R 31/318541 |
| 2021/0111718 A1* | 4/2021 | Gao | ..................... | H03K 17/005 |

* cited by examiner

*Primary Examiner* — Anh Q Tran
(74) *Attorney, Agent, or Firm* — Morgan, Lewis & Bockius LLP

(57) ABSTRACT

An electronic device includes two multiplexer branches, a modulation circuit, and an output interface coupled to the modulation circuit and two multiplexer branches. A first multiplexer branch generate s first output signal from a first selection signal, a first inverse signal, and a first input signal. The first inverse signal is substantially complementary to the first selection signal. A second multiplexer branch generates a second output signal from the first selection signal, the first inverse signal, and a second input signal. The modulation circuit generates a logic output signal from the first input signal and the second input signal, independently of the first selection signal and the first inverse signal. The output interface generates a multiplexed signal tracking one of the first input signal and the second input signal based on the first output signal, the second output signal, and the logic output signal.

20 Claims, 11 Drawing Sheets

PAM3: Truth Table for 3 to 1 MUX

| | Output 710 | SEL1 706 | SEL1_B 708 | SEL0 306 | SEL0_B 308 | Note |
|---|---|---|---|---|---|---|
| 722 | Input A 302 | 0 | 1 | 1 | 0 | |
| 724 | Input B 304 | 0 | 1 | 0 | 1 | |
| 726 | Input C 702 | 1 | 0 | 1 (optional) | 0 (optional) | |
| 728 | Potentially Floating | 1 | 1 | 1 | 1 | Not Normal |
| 730 | Potentially Floating | 0 | 0 | 0 | 0 | Not Normal |

FLOATING VOLTAGE SUPPRESSION IN HIGH SPEED MULTIPLEXERS

TECHNICAL FIELD

The disclosed embodiments relate generally to data transmission technology, including but not limited to methods, systems, and devices for controlling floating voltage states in a multiplexer applied in a data communication path.

BACKGROUND

Many electronic devices are physically coupled to and communicate with one another using data links and interfaces that comply with high-speed data communication protocols. These data communication protocols rely on high fidelity complementary signals to control data transmitted over the data links and interfaces. For example, such complementary signals are applied as selection signals in a multiplexer to select one of multiple input signals. If the complementary signals experience different delays, they can both stay at "1" (high level) or "0" (low level) momentarily for a short period of time corresponding to each switching edge. During this short period of time, an intermediate voltage node or an output of the multiplexer can be decoupled from power supplies of the multiplexer, thereby causing a startup or function failure in the multiplexer and associated circuit. Current technology does not provide an efficient mechanism to control floating voltage states in a multiplexer in a data communication path.

SUMMARY

This application is directed to electronic systems, electronic devices, data links, data ports, and data interfaces that control floating voltage states in a multiplexer applied in a data communication path. In some embodiments, the data communication path complies with a high-speed data communication protocol (e.g., USB4 v1.0, USB4 v2.0 Gen 4 PAM-3, or PCIe). A multiplexer selects one of a plurality of input signals as an output signal under the control of a single-ended or differential selection signal. In some situations, a combination of a selection signal and the input signals causes an intermediate or output node of the multiplexer to float and be decoupled from any current path to power supplies of the multiplexer, thereby causing a circuit startup or function failure. A modulation circuit combines the input signals and is applied to control the output signal, independently of the selection signal. This modulation circuit does not wait to detect a floating voltage state of the multiplexer or take an action upon detection of the floating voltage state. Rather, the modulation circuit operates concurrently with or prior to signal selection of the multiplexer, thereby preventing the floating voltage state from occurring with the multiplexer particularly when the multiplexer is applied in a high speed data communication path.

In one aspect, an electronic device includes a first multiplexer branch, a second multiplexer branch, a modulation circuit, and an output interface. The first multiplexer branch is configured to generate a first output signal from a first selection signal, a first inverse signal, and a first input signal. The first inverse signal is substantially complementary to the first selection signal. The second multiplexer branch is configured to generate a second output signal from the first selection signal; the first inverse signal; and a second input signal. The modulation circuit is configured to generate a logic output signal from the first input signal and the second input signal, independently of the first selection signal and the first inverse signal. The output interface is coupled to the modulation circuit, the first multiplexer branch, and the second multiplexer branch. The output interface is configured to generate a multiplexed output signal tracking one of the first input signal and the second input signal based on the first output signal, the second output signal, and the logic output signal.

In some embodiments, the modulation circuit is configured to hold an input of the output interface to the logic output signal, when the first input signal and the second input signal are disabled or when the first input signal and the second input signal are enabled. In some embodiments, the modulation circuit is configured to provide a current path, coupling an input of the output interface to a first supply voltage when the first input signal and the second input signal are disabled or to a second supply voltage when the first input signal and the second input signal are enabled. In some embodiments, the modulation circuit provides a current path to outputs of the first multiplexer branch and the first multiplexer branch, (1) when both the first inverse signal and the first selection signal are enabled and when the first input signal and the second input signal are disabled; or (2) when both the first inverse signal and the first selection signal are disabled and when the first input signal and the second input signal are enabled In another aspect, a multiplexer includes a first multiplexer branch, a second multiplexer branch, a modulation circuit, and an output interface. The first multiplexer branch is configured to generate a first output signal from a first selection signal, a first inverse signal, and a first input signal. The first inverse signal is substantially complementary to the first selection signal. The second multiplexer branch is configured to generate a second output signal from the first selection signal, the first inverse signal, and a second input signal. The modulation circuit is configured to generate a logic output signal from the first input signal and the second input signal, independently of the first selection signal and the first inverse signal. The output interface is coupled to the modulation circuit, the first multiplexer branch, and the second multiplexer branch. The output interface is configured to generate a multiplexed signal tracking one of the first input signal and the second input signal based on the first output signal, the second output signal, and the logic output signal.

Further, in some embodiments, the electronic device further includes a third multiplexer branch configured to generate a third output signal based on a second selection signal, a second inverse signal, and a third input signal. The second inverse signal is substantially complementary to the second selection signal. The modulation circuit is configured to generate the logic output signal from the first, second, and third input signals. The multiplexed output signal generated by the output interface is configured to track one of the first, second, and third input signals based on the first, second, third, and logic output signals In yet another aspect, a method is implemented to multiplex input signals. The method includes obtaining a first selection signal, a first inverse signal, a first input signal, and a second input signal. The first inverse signal is substantially complementary to the first selection signal. The method includes generating a first output signal based on the first selection signal, the first inverse signal, and the first input signal, generating a second output signal based on the first selection signal, the first inverse signal, and the second input signal, and generating a logic output signal from the first and second input signals, independently of the first selection signal and the first inverse signal. The method further includes generating a multiplexed signal tracking one of the first and second input signals based on the first output signal, the second output signal, and the logic output signal.

In yet another aspect, a method is implemented to provide a multiplexer. The method includes providing a first multiplexer branch configured to obtain a first selection signal, a first inverse signal, and a first input signal and generate a first output signal. The first inverse signal is substantially complementary to the first selection signal. The method further includes providing a second multiplexer branch configured to obtain the first selection signal, the first inverse signal, and a second input signal and generate a second output signal. The method further includes providing a modulation circuit configured to generate a logic output signal from the first and second input signals, independently of the first selection signal and the first inverse signal. The method further includes providing an output interface coupled to the modulation circuit, the first multiplexer branch, and the second multiplexer branch. The output interface is configured to generate a multiplexed signal tracking one of the first and second input signals based on the first output signal, the second output signal, and the logic output signal.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
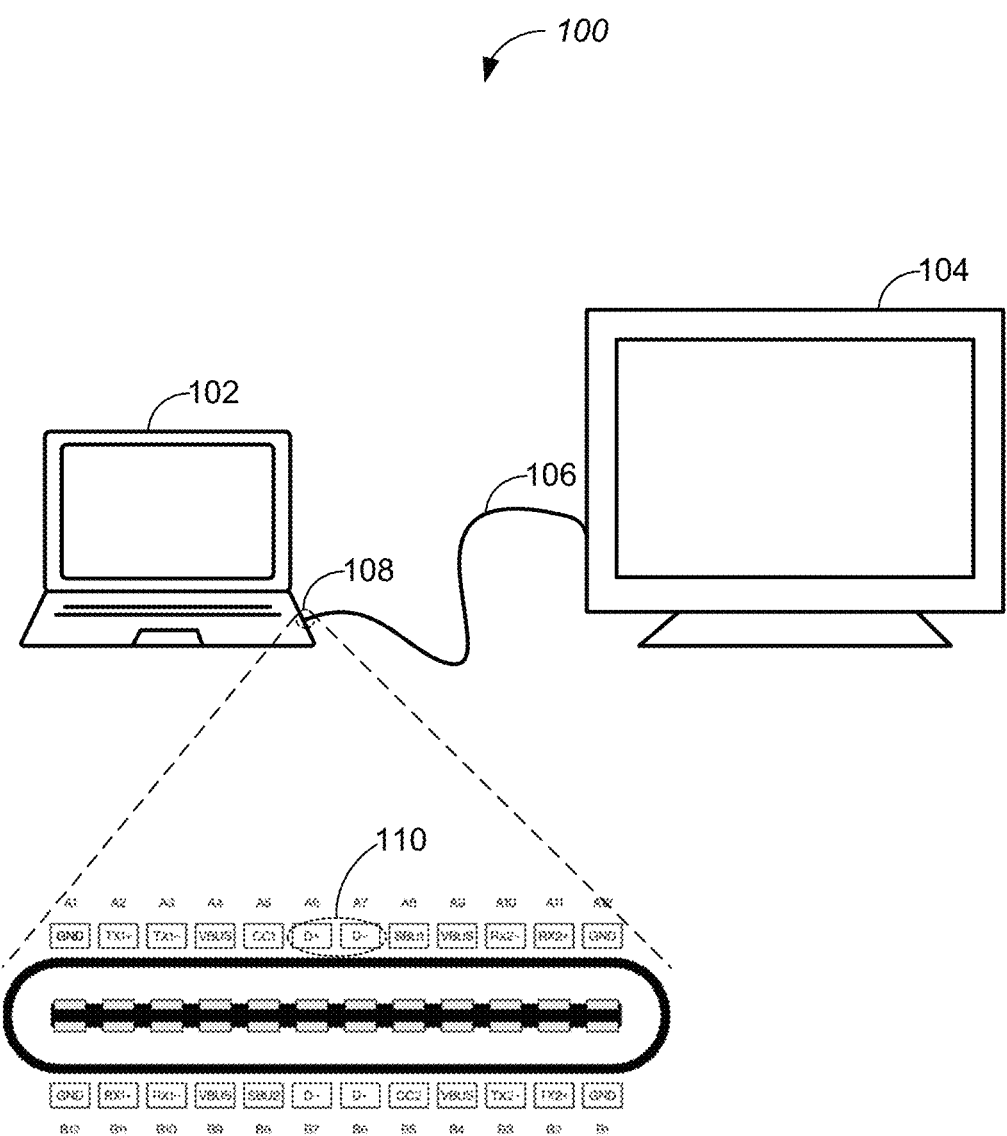
FIG. 1 is a block diagram of an example electronic system in which electronic devices are electrically via a data link, in accordance with some embodiments.

FIG. 1 is a block diagram of an example electronic system 100 in which a first electronic device 102 is electrically coupled to a second electronic device 104 via a data link 106, in accordance with some embodiments. The first electronic device 102 and second electronic device 104 are configured to exchange data via the data link 106. In an example, the first electronic device 102 includes a video source, and the second electronic device 104 includes a display device. The display device has a screen configured to display visual content provided by the first electronic device 102 via the data link 106. In another example not shown, the first electronic device 102 includes a desktop computer, and the second electronic device 104 includes a mobile phone that exchanges data with the desktop computer via the data link 106. Examples of the electronic devices 102 and 104 include, but are not limited to, a desktop computer, a laptop computer, a tablet computer, a video player, a camera device, a gameplayer device, or other formats of electronic devices which are configured to provide data or receive data. Video data, audio data, text, program data, control data, configuration data, or any other data are transmitted between the first and second electronic devices 102 and 104 via the data link 106.

The data link 106 includes two connectors 108 at two of its ends. The two connectors 108 are configured to connect the data link 106 to respective connectors 108 of the first electronic device 102 and second electronic device 104. For example, the connector 108 is a DisplayPort connector having a digital display interface developed by a consortium of personal computer and chip manufacturers and standardized by the Video Electronics Standards Association (VESA). The DisplayPort connector is configured to connect the data link 106 to the first electronic device 102 and carry video, audio, and control data according to a data communication protocol. In another example, the connector 108 is a universal serial bus (USB) connector. e.g., configured to connect a computer to a peripheral device. Exemplary types of the USB connector include, but are not limited to: USB-A, USB-B, USB-C, USB Micro-A, USB Micro-B, USB Mini-B, USB 3.0A, USB 3.0B, USB 3.0 Micro B, and USB Micro-AB. Further, a data communication protocol of USB4 is applied to communicate data using a USB-C connector, thereby providing a throughput of up to 40 Gbps, power delivery of up to 100 W, support for 4K and 5K displays, and backward compatibility with USB 3.2 and USB 2.

In some embodiments, the connector 108 includes a bidirectional channel for communicating a stream of data between the first and second electronic device 102 and 104. The bidirectional channel of the connector 108 includes two data lanes and a pair of differential pins 110 coupled to the two data lanes. The pair of differential pins 110 are configured to receive a differential input signal from the first electronic device 102 or the second electronic device 104, and the differential input signal carries a serial data command or serial content data (e.g., video or audio data) that are communicated via the two data lanes of the connector 108. As such, the two data lanes and pair of differential pins 110 of the connector 108 are configured to facilitate bidirectional communication between the first electronic device 102 and the second electronic device 104. The bidirectional channel is a data channel or an auxiliary channel. Specifically, the auxiliary channel of the connector 108 is used for communication of additional serial data beyond video and audio data, such as consumer electronics control (CEC) commands. In some embodiments, the pair of differential pins 110 is coupled to a dedicated set of twisted-pair wires configured to carry two input signals of the differential input signal.

Each connector 108 of the data link 106 is configured to be coupled to a respective connector 108 of the first electronic device 102 and a respective connector 108 of the second electronic device 104. Each connector 108 of the data link 106 is bidirectional, so is each respective connector 108 of the electronic devices 102 and 104. When the connector 108 of the data link 106 is coupled to the first or second electronic device 102 or 104, the pair of differential pins 110 of the connector 108 of the data link 106 are physically and electrically coupled to a pair of differential pins 110 of the connector 108 of the first or second electronic device 102 or 104. The pair of differential pins 110 of the connector 108 of the first or second electronic device 102 or 104 is configured to receive data from, or transmit data to, the differential pins 110 of the connector 108 of the data link 106.

Figure 2:
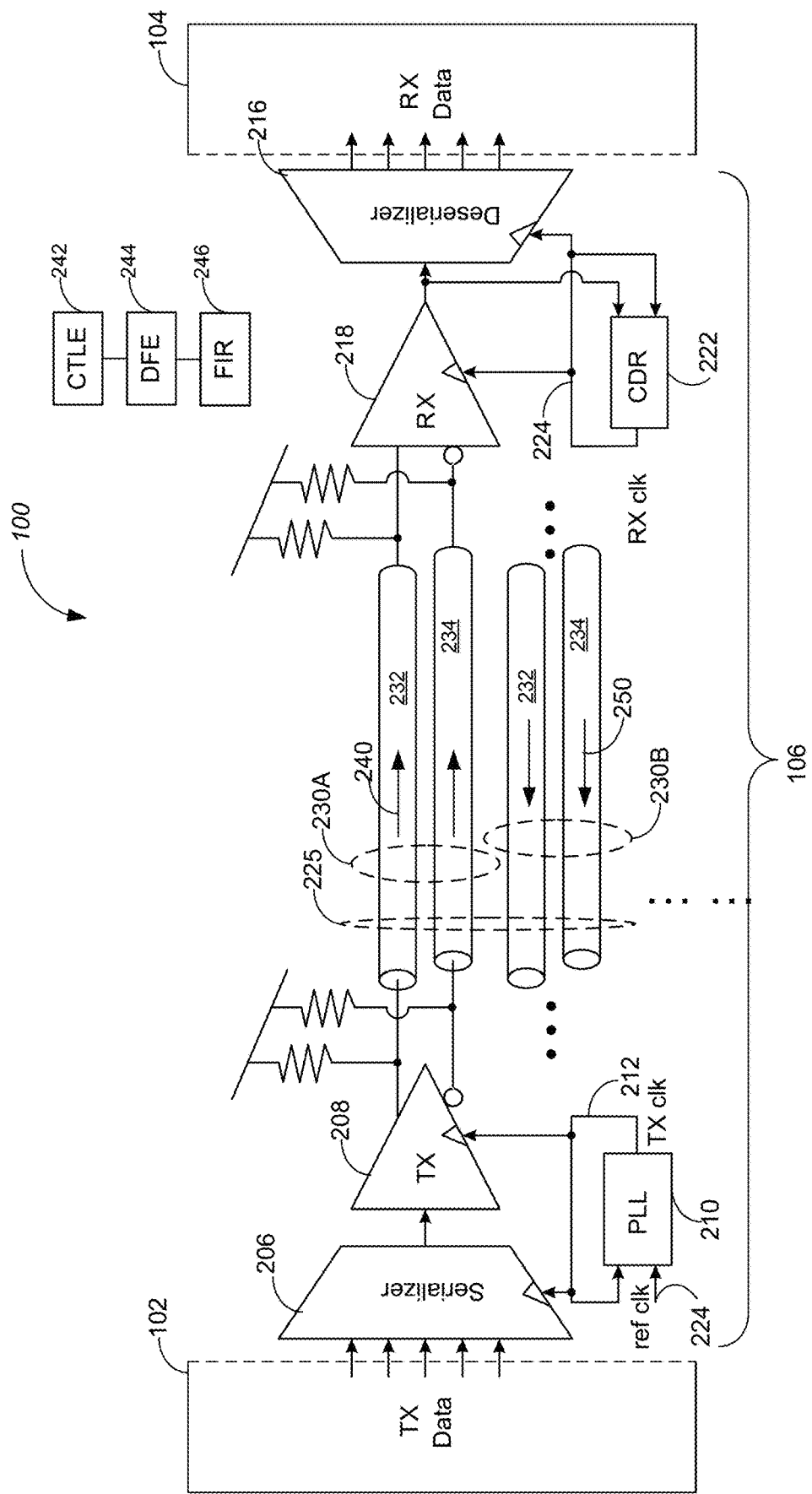
FIG. 2 is an example electronic system in which a first electronic device or component is electrically coupled to a second electronic device or component via a data link, in accordance with some embodiments.

FIG. 2 is a schematic diagram of another example electronic system 100 in which a first electronic device or component 102 is electrically coupled to a second electronic device or component 104 via a data link 106, in accordance with some implementations. In an example, the first electronic device 102 includes a central processing unit (CPU) of a personal computer, and the second electronic device 104 is a peripheral component of the personal computer, such as a graphics card, a hard drive, a solid state drive, a Wi-Fi communication module, or an Ethernet card. The data link 106 includes a connection port for receiving from the second electronic device 104. The connection port is optionally formed on a mother board of the personal computer. In some implementations, the data link 106 complies with a high-speed serial computer expansion bus standard (e.g., PCI Express (PCIe), USB 4) and provides an interface to communicate data packets between the first and second electronic devices 102 and 104 in compliance with the bus standard. The data link 106 is a serial data bus including one or more data channels 225. In some embodiments, each data channel 225 includes two wire sets 230A and 230B (also called two data lanes) for transmitting and receiving data packets, respectively, thereby supporting full-duplex communication between the first and second electronic devices 102 and 104. In some examples, the data link 106 has 1, 4, 8, or 16 channels coupled in a single data port of the data link 106. For each data channel 225, the two wire sets 230A and 230B correspond to a downstream data direction 240 or an upstream data direction 250 defined with respect to the first electronic device 102. Optionally, each wire set 230A or 230B includes two respective wires 232 and 234 for carrying a pair of differential signals.

In some implementations, the first electronic device 102 includes or is coupled to a root complex device (not shown) that is further coupled to the data link 106. The root complex device is configured to generate requests for transactions including a series of one or more packet transmissions on behalf of the first electronic device 102. Examples of the transactions include, but are not limited to, Memory Read, Memory Read Lock, Input Output (IO) Read, IO Write, Configuration Read, Configuration Write, and Message. In some implementations, the first electronic device 102 is coupled to one or more additional electronic devices besides the second electronic device 104. The data link 106 includes one or more switch devices to couple the root complex device of the first electronic device 102 to multiple endpoints including the second electronic device 104 and additional electronic devices not shown in FIGS. 1 and 2.

A data transmission protocol (e.g., PCI Express) is established based on a layered model including an application layer, a transaction layer, a data link layer, and a physical layer. As the top layer, the application layer is implemented in software programs, such as Ethernet, NVMe, SOP, AHCI, and SATA. In the transaction layer, each transaction of a series of packet transmissions is implemented as requests and responses separated by time. For example, a memory-related transaction is translated to device configuration and control data transferred to or from the second electronic device 104 (e.g., a memory device). Data packets associated with each transaction are managed by data flows on the data link layer. The physical layer controls link training and electrical (analog) signaling, and includes a logical block and an electrical block. The logic block defines ordered data sets in training states, and the electrical block defines eye diagram characteristics and analog waveforms. Each layer of the layered model includes first specifications for a transmitting side where a root complex device is coupled and second specifications for a receiving side where a peripheral component (i.e., the second electronic device 104) is coupled.

As signals are transmitted within the wire sets 230 of each data channel 225 of the data link 106, the signals are distorted and spread over sequential symbols and result in inter symbol interferences (ISI) and bit errors at the receiving side of the second electronic device 104. In some implementations, these ISI and bit errors can be suppressed by a finite impulse response (FIR) driver that is coupled serially on a path of the data link 106 and configured with equalization settings using an equalization procedure. For example, the equalization procedure is implemented when a high speed data transfer rate needs to be initialized, when an equalization request is issued from the application layer, or when a bit error rate (BER) exceeds a data error tolerance.

The electronic system 100 includes a serializer and deserializer (SERDES) system corresponding to the data link 106. The SERDES system of the data link 106 includes a serializer 206, a transmitter 208, the data channel 225, a receiver 218, and a deserializer 216. The serializer 206 converts parallel data received from the first electronic device 102 to serial data. The transmitter 208 sends the serial data to the data channel 225. The receiver 218 processes the serial data and send the processed serial data to the deserializer 216, which converts the serial data back to the parallel data for the second electronic device 104. In some implementations, the receiver 218 includes an FIR driver. On a transmitting side, a phase lock loop 210 generates a transmitter clock signal 212 based on a reference clock 224, and the transmitter clock signal 212 is applied to control serialization of the data to be transmitted by the data channel 225 of the data link 106.

On a receiving side, a clock data recovery (CDR) circuit 222 is used to recover a receiver clock signal 224 from the serial data received via the data channel 225 and compensate a variation of signal amplitudes caused by a loss and other factors in this data channel 225. The receiver clock signal 224 is used with the receiver 218 and deserializer 216 to condition the serial data received via the data channel 226 and regenerate the parallel data from the serial data. During this process, the receiver 218 is configured to reduce signal distortion, data spreading over sequential symbols, inter symbol interferences, and resulting bit errors of the serial data on the receiving side of the second electronic device 104. Specifically, in some embodiments, the receiver 218 includes a continuous time linear equalizer (CTLE) 242, a decision feedback equalizer (DFE) 244, and an FIR driver 246. The CTLE 242 is configured to selectively attenuate low frequency signal components, amplify signal components around the Nyquist frequency, and remove higher frequency signal components to generate filtered serial data. The DFE 244 is configured to further amplify the filtered serial data, e.g., using level shifters, and recover one or more data bits at each clock switching edge or during each clock cycle. The one or more recovered data bits form data packets. The FIR driver 246 has a plurality of equalization settings (e.g., filtering coefficients), and is applied to improve signal quality of the data packets via digital signal conditioning (e.g., via high frequency filtering in a digital domain).

In some embodiments, the DFE 244 includes a loop-unroll DFE and is optionally used in wireless or wired communication. The DFE 244 includes a multiplexer configured to select one of a plurality of input signals based on a selection signal. For each input signal, ISI has been pre-compensated on a plurality of ISI compensation levels. The selection signal is generated based on previous data, and corresponds to a desirable ISI compensation level determined from the previous data. The one of the plurality of input signals is selected by the selection signal based on the desirable ISI compensation level. Further, in some situations, the selection signal includes two substantially complementary selection signals generated based on the previous data. The two substantially complementary selection signals correspond to two different timing paths and two different delays, thereby failing to be strictly complementary or opposite to each other. Instead, the two substantially complementary selection signals both stay at "1" (high level) or "0" (low level) momentarily for a short period of time corresponding to each switching edge of the selection signal. During this short period of time, an intermediate or output node of the multiplexer is floating and decoupled from any power supply, thereby potentially causing a circuit startup or function failure in the multiplexer.

In various embodiments of this application, a modulation circuit is coupled to an output interface of a multiplexer to suppress floating voltage states of the multiplexer, particularly when the multiplexer is applied in a data communication path that operates under a high speed data communication protocol (e.g., USB4 v1.0, USB4 v2.0 Gen 4 PAM-3, PCIe). A multiplexer selects one of a plurality of input signals as an output signal under the control of a selection signal. The modulation circuit combines the input signals and is applied to control the output signal, independently of the selection signal. This modulation circuit does not wait for the output signal to be generated, detect a floating voltage state, or take an action upon detection of the floating voltage state. Rather, the modulation circuit creates a current path to a certain power supply concurrently with or prior to an selection operation of the multiplexer, thereby preventing the floating voltage state from occurring to the multiplexer particularly when the multiplexer is applied in a high speed data communication path. In some embodiments, the multiplexer integrated with the modulation circuit is applied in the DFE 244 associated with the data link 106. Alternatively, in some embodiments, the multiplexer integrated with the modulation circuit is not applied in the data link 106. In some embodiments, the multiplexer integrated with the modulation circuit is configured to select one of an integer number N of input signals, where the integer number N is equal to 2, 3, 4, . . . and the like.

Figures 3A, 3B:
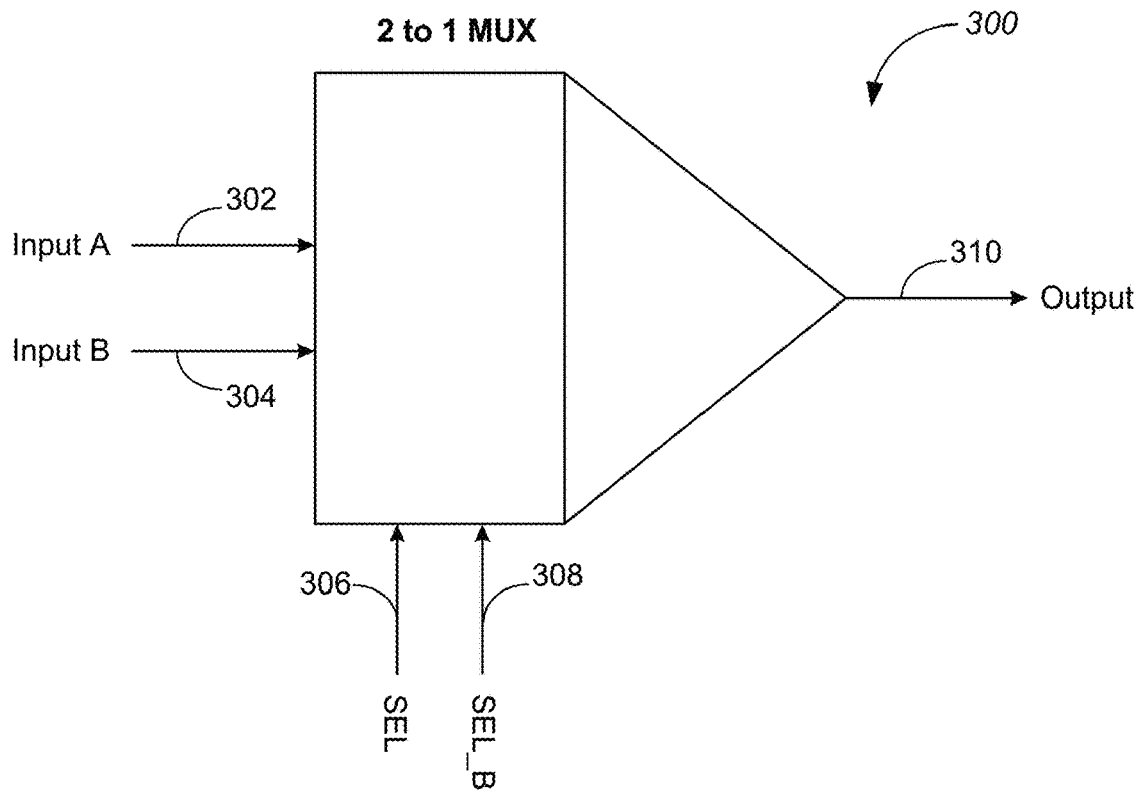
FIG. 3A is a symbolic diagram of an example two-input (2:1) multiplexer, in accordance with some embodiments.
FIG. 3B is a truth table of the two-input multiplexer shown in FIG. 3A, in accordance with some embodiments.

FIG. 3A is a symbolic diagram of an example two-input (2:1) multiplexer 300, in accordance with some embodiments, and FIG. 3B is a truth table 320 of the two-input multiplexer 300 shown in FIG. 3A, in accordance with some embodiments. The 2:1 multiplexer 300 receives a first input signal 302, a second input signal 304, a first selection signal 306, and a first inverse signal 308, and selects one of the first input signal 302 and the second input signal 304 as a multiplexed output signal 310 based on the first selection signal 306 and the first inverse signal 308. Stated another way, the 2:1 multiplexer 300 is controlled by the first selection signal 306 and the first inverse signal 308 to generate the multiplexed output signal 310 tracking the selected one of the first input signal 302 and the second input signal 304. In some embodiments, the multiplexed output signal 310 has a delay (e.g., ~0.3 ns) from the selected one of the first input signal 302 and the second input signal 304.

The first inverse signal 308 is substantially complementary and opposite to the first selection signal 306. In some embodiments (e.g., FIG. 6A), the first inverse signal 308 is substantially complementary and opposite to the first selection signal 306 at any time. Alternatively, in some embodiments (e.g., FIG. 6B), both the first inverse signal 308 and the first selection signal 306 are enabled for a plurality of first durations corresponding to a plurality of first switching edges of the first selection signal 306, and both the first inverse signal and the first selection signal are disabled for a plurality of second durations corresponding to a plurality of second switching edges of the first selection signal 306. Each of the first and second durations is less than a threshold duration length (e.g., 0.1 ns) when the first inverse signal 308 is substantially complementary to the first selection signal 306. In other words, the first selection signal 306 and the first inverse signal 308 are substantially complementary to each other even if the first selection signal 306 and the first inverse signal 308 are both enabled or disabled for short durations of time (i.e., durations that are shorter than threshold duration length).

In some embodiments, a length of a propagation path or a load of the first selection signal 306 is greater than that of the first inverse signal 308. A rising or falling edge of the first selection signal 306 is delayed by a delay time with respect to a corresponding falling or rising edge of the first inverse signal 308, respectively. Conversely, in some embodiments, a length of a propagation path or a load of the first selection signal 306 is less than that of the first inverse signal 308. A rising or falling edge of the first inverse signal 308 has a delay time with respect to a corresponding falling or rising edge of the first selection signal 306, respectively. As a result of the delay times, the first selection signal 306 and the first inverse signal 308 are both enabled or disabled for short durations of time.

Referring to FIG. 3B, in some embodiments (322), the first selection signal 306 is enabled (i.e., "1") at a high supply voltage (e.g., VDD), and the first inverse signal 308 is disabled (i.e., "0") at a low supply voltage (e.g., GND, VSS). The multiplexer 300 selects the first input signal 302 as the multiplexed output signal 310. Conversely, in some embodiments (324), the first selection signal 306 is disabled (i.e., "0") at the low supply voltage, and the first inverse signal 308 is enabled (i.e., "1") at the high supply voltage. The multiplexer 300 selects the second input signal 304 as the multiplexed output signal 310. In some embodiments (326), both of the first selection signal 306 and the first inverse signal 308 are disabled (i.e., "0") at the low supply voltage, and one or more nodes of the multiplexer 300 float and are not electrically coupled to any power supply by a current path, which may cause a startup or function failure in the multiplexer 300. In some embodiments (328), both of the first selection signal 306 and the first inverse signal 308 are enabled (i.e., "1") at the high supply voltage, and one or more nodes of the multiplexer 300 float and are not connected to any power supply by a current path, which may cause a startup or function failure in the multiplexer 300.

Figure 4:
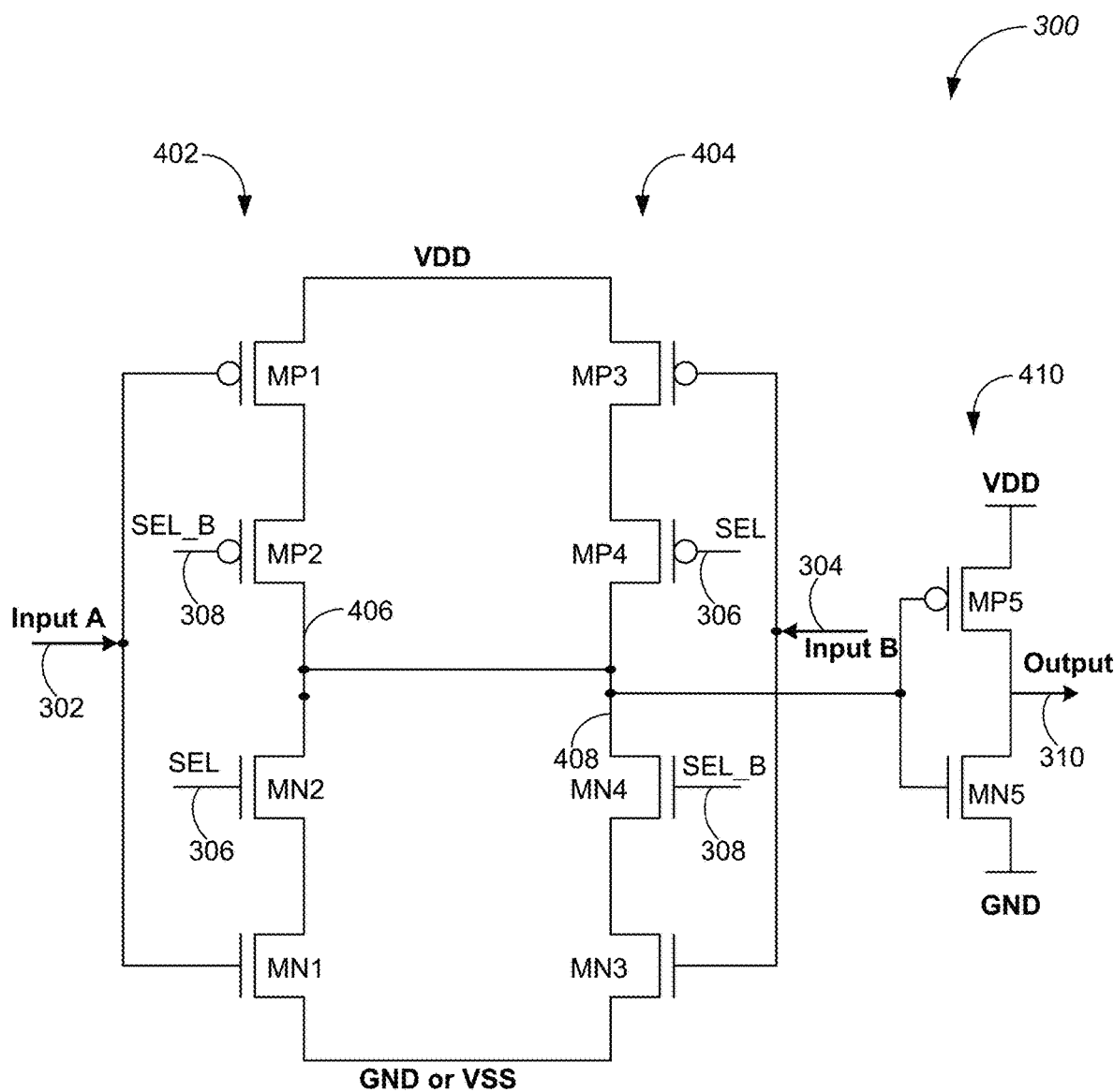
FIG. 4 is a circuit diagram of an example two-input multiplexer, in accordance with some embodiments.

FIG. 4 is a circuit diagram of an example two-input (2:1) multiplexer 300, in accordance with some embodiments. The 2:1 multiplexer 300 includes two multiplexer branches 402 and 404 and an output interface 410. The two multiplexer branches includes a first multiplexer branch 402 and a second multiplexer branch 404. The first multiplexer branch 402 is configured to generate a first output signal 406 from a first selection signal 306 (SEL), a first inverse signal 308 (SEL_B), and a first input signal 302 (Input A). The first inverse signal 308 is substantially complementary to the first selection signal 306. The second multiplexer branch 404 is configured to generate a second output signal 408 from the first selection signal 306 (SEL), the first inverse signal 308 (SEL_B), and a second input signal 304 (Input B). The output interface 410 is coupled to both outputs of the two multiplexer branches 402 and 404, and configured to generate a multiplexed output signal 310 tracking one of the first input signal 302 and the second input signal 304 based on the first output signal 406 and the second output signal 408.

In some embodiments, the first multiplexer branch 402 includes a plurality of P-type transistors (e.g., MP1 and MP2) and a plurality of N-type transistors (e.g., MN1 and MN2), and the plurality of P-type transistors and the plurality of N-type transistors of the first multiplexer branch 402 are coupled in series and between two distinct power supplies (e.g., VDD and GND, VDD and VSS). Specifically, in an example, the first input signal 302 is coupled to a gate of a first P-type transistor MP1 and a gate of a first N-type transistor MN1. The first selection signal 306 and the first inverse signal 308 are coupled to a gate of a second N-type transistor MN2 and a gate of a second P-type transistor MP2, respectively. Alternatively, in another example (not shown), the first input signal 302 is coupled to the gates of the first P-type transistor MP1 and the second N-type transistor MN2. The first selection signal 306 and the first inverse signal 308 are coupled to the gates of the first N-type transistor MN1 and the second P-type transistor MP2, respectively. Alternatively, in another example (not shown), the first input signal 302 is coupled to the gates of the second P-type transistor MP2 and the second N-type transistor MN2. The first selection signal 306 and the first inverse signal 308 are coupled to the gates of the first N-type transistor MN1 and the first P-type transistor MP1, respectively.

In some embodiments, the second multiplexer branch 404 includes a plurality of P-type transistors (e.g., MP3 and MP4) and a plurality of N-type transistors (e.g., MN3 and MN4), and the plurality of P-type transistors and the plurality of N-type transistors of the second multiplexer branch 404 are coupled in series and between the two distinct power supplies (e.g., VDD and GND), i.e., in parallel with the first multiplexer branch 402. The second input signal 304 is coupled to a gate of one of the P-type transistors MP3 and MP4 and a gate of one of the N-type transistors MN3 and MN4 of the second multiplexer branch 404. The first selection signal 306 and the first inverse signal 308 are coupled to a gate of the other one of the P-type transistors MP3 and MP4 and a gate of the other one of the N-type transistors MN3 and MN4 of the second multiplexer branch 404, respectively.

In some embodiments, the output interface 410 includes a complementary metal-oxide semiconductor (CMOS) inverter including an output P-type transistor MP5 and an output N-type transistor MN5. An input of the CMOS inverter is coupled to both of the outputs of the first multiplexer branch 402 and the second multiplexer branch 404. Stated another way, the first output signal 406 and the second output signal 408 are electrically coupled to each other and to the input of the CMOS inverter. An output of the CMOS inverter is configured to output the multiplexed output signal 310 tracking the selected one of the first and second input signals 302 and 304 with a delay.

Referring to FIG. 4, in some situations, both of the first selection signal 306 and the first inverse signal 308 are disabled at a low supply voltage (i.e., set at "0"). The N-type transistors MN2 and MN4 are turned off, and current paths connecting outputs of the two multiplexer branches 402 and 404 to a low power supply (e.g., GND, VSS) are disabled, independently of the first and second input signals 302 and 304. The P-type transistors MP2 and MP4 are turned on. If the first input signal 302 and the second input signal 304 are enabled at a high supply voltage (i.e., set to "1"), current paths connecting the outputs of the two multiplexer branches 402 and 404 to a high power supply (e.g., VDD) are also disabled, causing the outputs of the two multiplexer branches 402 and 404 to float. Alternatively, in some situations, both of the first selection signal 306 and the first inverse signal 308 are enabled at the high supply voltage (i.e., set at "1"). The P-type transistors MP2 and MP4 are turned off, and current paths connecting the outputs of the two multiplexer branches 402 and 404 to the high power supply (e.g., VDD) are disabled, independently of the first and second input signals 302 and 304. The N-type transistors MN2 and MN4 are turned on. If the first input signal 302 and the second input signal 304 are disabled at the low supply voltage (i.e., set to "0"), current paths connecting the outputs of the two multiplexer branches 402 and 404 to the low power supply (e.g., VSS) are disabled, causing the outputs of the two multiplexer branches 402 and 404 to float. As such, the multiplexer 300 enters floating voltage states, which may cause a circuit startup or function failure. (1) when the first selection signal 306 and first inverse signal 308 are disabled and the first and second input signals 302 and 304 are enabled or (2) when the first selection signal 306 are first inverse signal 308 are enabled and the first and second input signals 302 and 304 are disabled.

Figure 5:
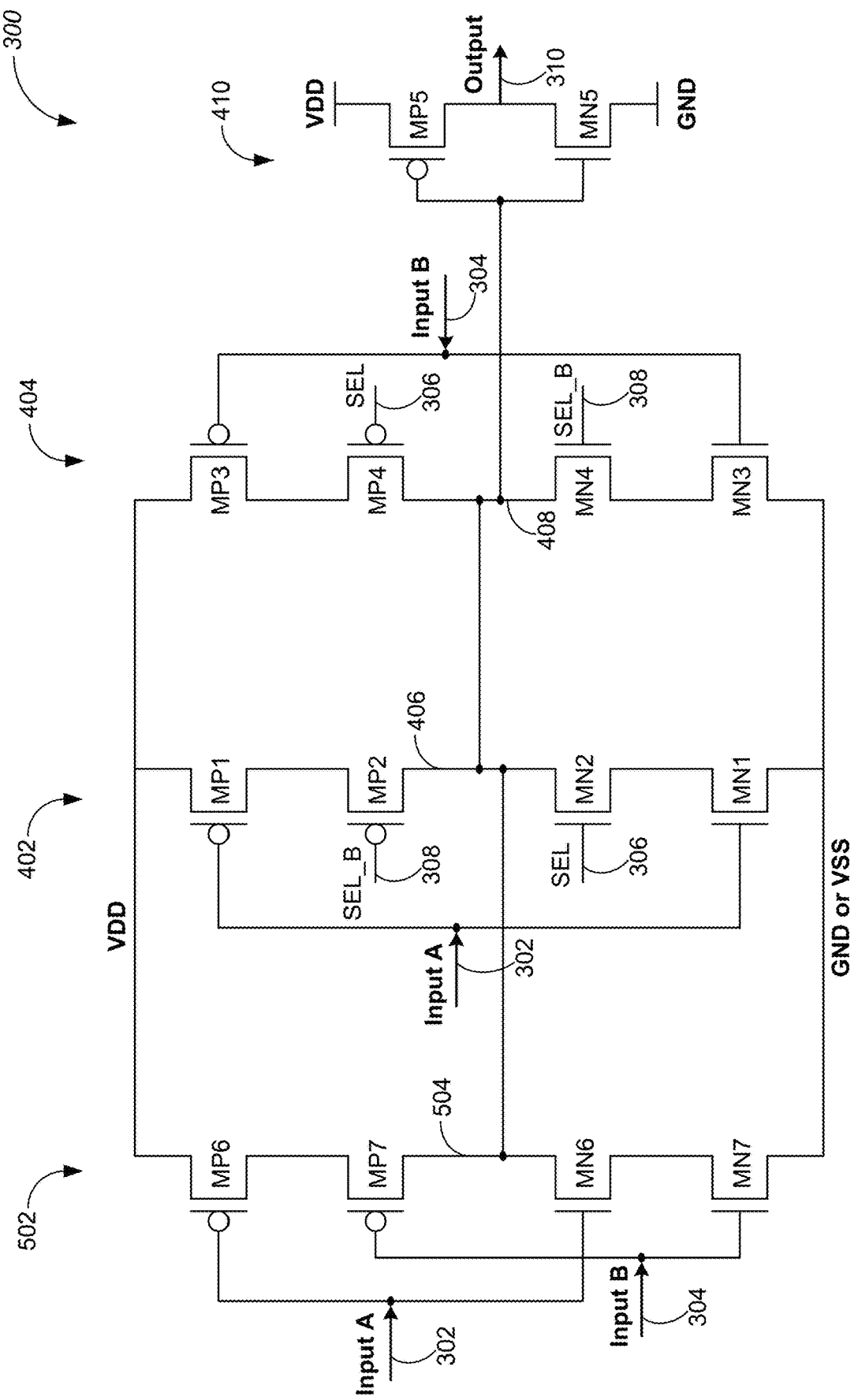
FIG. 5 is a circuit diagram of another example two-input multiplexer including a modulation circuit for controlling floating voltage states, in accordance with some embodiments.

FIG. 5 is a circuit diagram of another example two-input (2:1) multiplexer 300 including a modulation circuit 502 for controlling floating voltage states, in accordance with some embodiments. The multiplexer 300 includes the modulation circuit 502 in addition to the two multiplexer branches 402 and 404 and the output interface 410. The modulation circuit 502 is configured to generate a logic output signal 504 from the first input signal 302 and the second input signal 304, independently of the first selection signal 306 and the first inverse signal 308. The output interface 410 is also coupled to an output of the modulation circuit 502 in addition to the outputs of the first multiplexer branch 402 and the second multiplexer branch 404. The output interface 410 is configured to generate a multiplexed output signal 310 tracking one of the first input signal 302 and the second input signal 304 based on the first output signal 406, the second output signal 408, and the logic output signal 504. Stated another way, an input of the output interface 410, the output of the first multiplexer branch 402, the output of the second multiplexer branch 404, and the output of the modulation circuit 502 are shorted to one another. In some embodiments, the multiplexed output signal 310 has a delay (e.g., ~0.3 ns) from the tracked one of the first input signal 302 and the second input signal 304.

The modulation circuit 502 is configured to hold the input of the output interface to the logic output signal 504, when the first and second input signals 302 and 304 are both enabled or when the first and second input signals 302 and 304 are both disabled. Particularly, in some situations, both the first inverse signal 308 and the first selection signal 306 are enabled, and a floating voltage state occurs to the two multiplexer branches 402 and 404 if the first and second input signals 302 and 304 are disabled. If the first and second input signals 302 and 304 are disabled. P-type transistors MP6 and MP7 of the modulation circuit 502 are turned on to provide a current path to the high power supply (e.g., VDD), thereby suppressing the floating voltage state of the multiplexer 300. Conversely in some situations, both the first inverse signal 308 and the first selection signal 306 are disabled, and the floating voltage state also occurs to the two multiplexer branches 402 and 404 if the first and second input signals 302 and 304 are enabled. If the first and second input signals 302 and 304 are enabled. N-type transistors MN6 and MN7 of the modulation circuit 502 are turned on to provide a current path to the low power supply (e.g., GND), thereby suppressing the floating voltage state of the multiplexer 300. In other words, the modulation circuit 502 is configured to provide a current path, coupling an input of the output interface 410 to (1) a first supply voltage (e.g., VDD), when both the first inverse signal 308 and the first selection signal 306 are enabled and when the first input signal 302 and the second input signal 304 are disabled: and (2) a second supply voltage (e.g., GND), when both the first inverse signal and the first selection signal are disabled and when the first input signal 302 and the second input signal 304 are enabled.

Alternatively, in some situations, when the first and second input signals 302 and 304 are both enabled or disabled, the first inverse signal 308 and the first selection signal 306 are opposite, and the logic output signal 504 is consistent with the selected one of the first input signal 302 and the second input signal 304. Additionally, in some situations, if one signal of the first and second input signals 302 and 304 is enabled and the other signal is disabled, a corresponding one of the two multiplexer branches 402 and 404 provides a current path to a high or low power supply to the input of the output interface 410. The floating voltage state does not occur to the two multiplexer branches 402 and 404, while the output of the modulation circuit 502 is floating.

Referring to FIG. 5, in some embodiments, the modulation circuit 502 includes a plurality of transistors coupled in series between a high supply voltage (e.g., VDD) and a low supply voltage (e.g., VSS, GND). The plurality of transistors include a first N-type transistor MN6, a second N-type transistor MN7, a first P-type transistor MP6, and a second P-type transistor MP7. The first input signal 302 is coupled to gates of the first P-type transistor MP6 and the first N-type transistor MN6, and the second input signal 340 is coupled to gates of the second P-type transistor MN7 and the second N-type transistor MN7. Further, in some embodiments, the first P-type transistor MP6 is coupled between the second P-type transistor MP7 and the high supply voltage, and the second N-type transistor MN7 is coupled between the first N-type transistor MN6 and the low supply voltage. Alternatively, in some embodiments not shown, while the first P-type transistor MP6 is coupled between the second P-type transistor MP7 and the high supply voltage MP7, the first N-type transistor MN6 is coupled between the second N-type transistor MN6 and the low supply voltage.

The modulation circuit 502 generates the logic output signal 504 based on the input signals 302 and 304, independently of the first selection signal 306 and the first inverse signal 308. The modulation circuit 502 combines the input signals 302 and 304 in such a manner that it may provide the input of the output interface 410 with a current path to a certain power supply, as the floating voltage state occurs to the two multiplexer branches 402 and 404. Conversely, as the floating voltage state does not occur to the two multiplexer branches 402 and 404, the modulation circuit 502 goes to its own floating voltage state or provides the logic output signal 504 that is consistent with the output signal 406 or 408, without interfering with operation of the two multiplexer branches 402 and 404. The modulation circuit 502 prepares the logic output voltage 504 in advance or concurrently to anticipate the floating voltage state of the two multiplexer branches 402 and 404, and therefore, does not disturb performance of the multiplexer 300 when the floating voltage state does not occur to the two multiplexer branches 402 and 404. By these means, the modulation circuit 502 does not wait for the first output signal 406, the second output signal 408, or the multiplexed output signal 310 to be available for detection of the floating voltage state, and offers an effective solution to suppress the floating voltage state in a high speed communication link (e.g., in which the first selection signal 306 has a frequency that is greater than a threshold frequency).

Figure 6A:
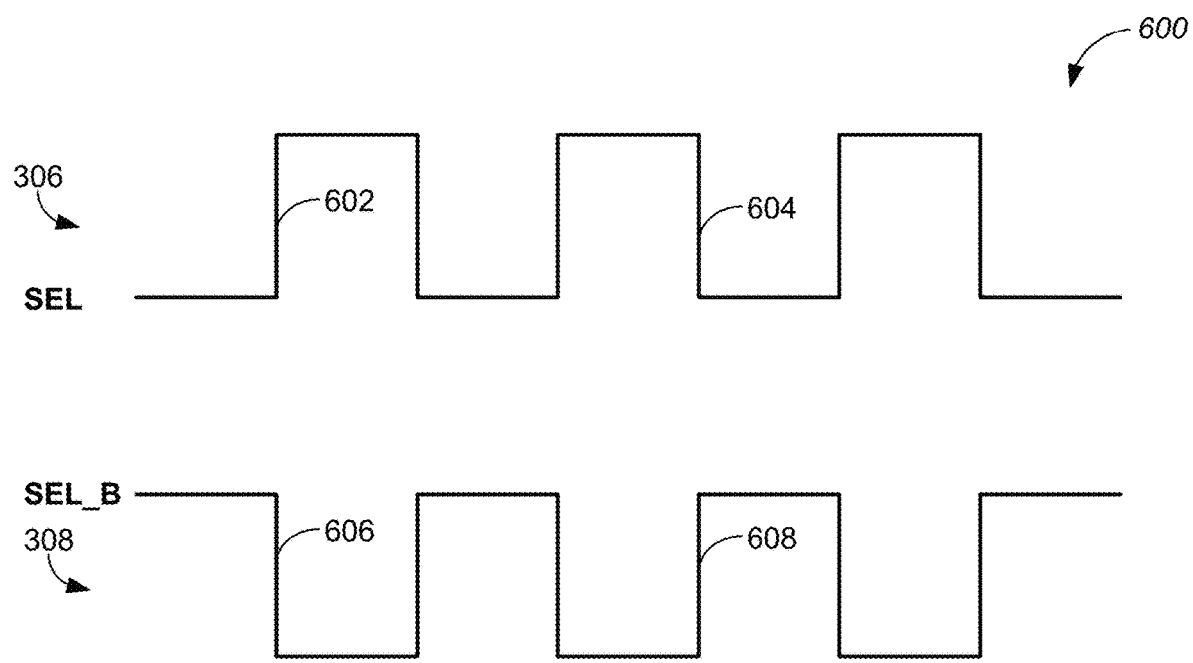
FIG. 6A is a temporal diagram of a selection signal and an inverse signal that are applied in a two-input multiplexer, in accordance with some embodiments.
Figure 6B:
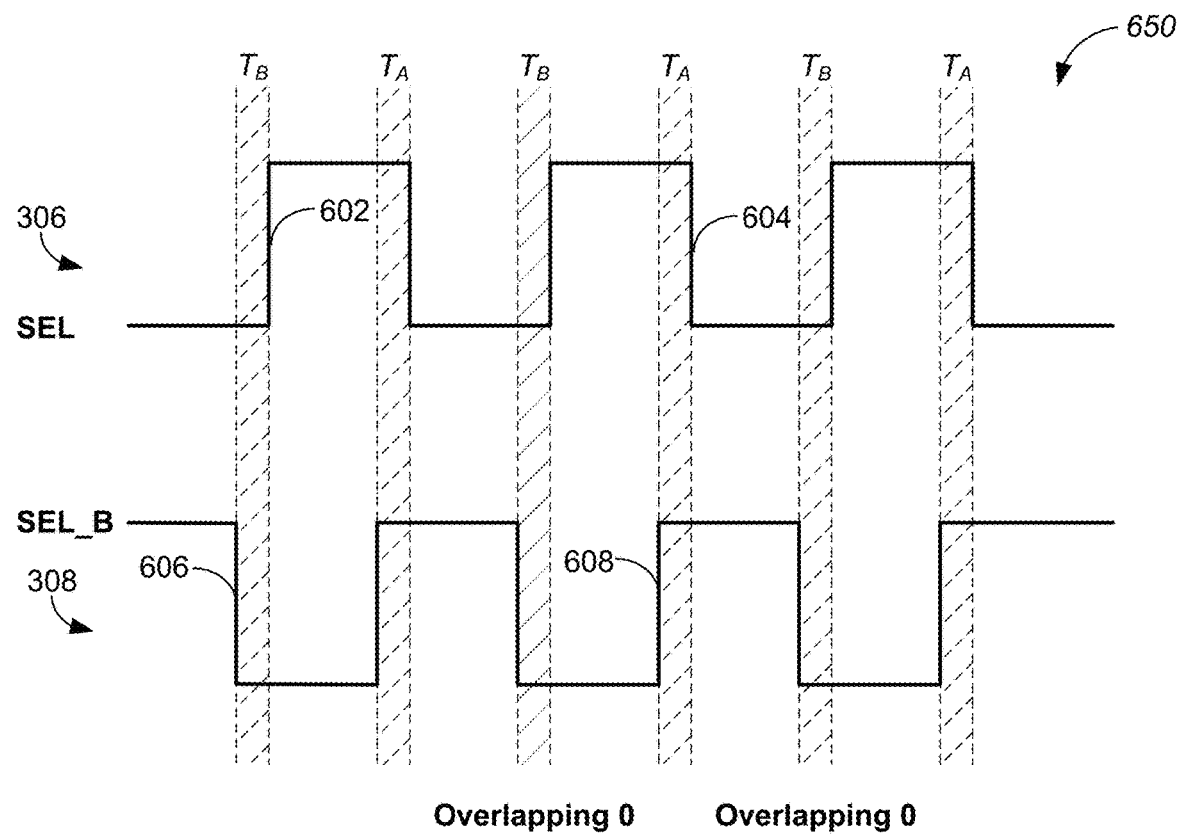
FIG. 6B is a temporal diagram of a selection signal and an inverse signal applied in a two-input multiplexer, in accordance with some embodiments.

FIG. 6A is a temporal diagram 600 of a selection signal 306 and an inverse signal 308 that are applied in a two-input multiplexer 300, in accordance with some embodiments, and FIG. 6B is a temporal diagram 650 of a selection signal 306 and an inverse signal 308 applied in a two-input multiplexer 300, in accordance with some embodiments. Referring to FIG. 6A, in some embodiments, the first inverse signal 308 is substantially complementary and opposite to the first selection signal 306 at any time of a time axis. Each switching edge 602-608 has a switching time that is controlled within a threshold switching time. Each switch edge 602-608 is one of a rising edge 602 and a falling edge 604 of the first selection signal 306 and a falling edge 606 and a rising edge 608 of the first inverse signal 308. Each rising edge 602 of the first selection signal 306 is temporally aligned (i.e., synchronous) with a respective falling edge 606 of the first inverse signal 308, and each falling edge 604 of the first selection signal 306 is temporally aligned (i.e., synchronous) with a respective rising edge 608 of the first inverse signal 308.

Referring to FIG. 6B, in some embodiments, rising edges 602 of the first selection signal 306 are not synchronous with respective falling edges 606 of the first inverse signal 308, and falling edges 604 of the first selection signal 306 are not synchronous with respective rising edges 608 of the first inverse signal 308. Both of the first inverse signal 308 and the first selection signal 306 are enabled for a plurality of first durations $T_A$ corresponding to a plurality of first switching edges (e.g., falling edges 604) of the first selection signal 306, and both of the first inverse signal 308 and the first selection signal 306 are disabled for a plurality of second durations $T_B$ corresponding to a plurality of second switching edges (e.g., rising edges 602) of the first selection signal 306. Each of the first and second durations $T_A$ and $T_B$ is less than a threshold duration length (e.g., 0.1 ns) when the first inverse signal 308 is substantially complementary to the first selection signal 306. In other words, the first selection signal 306 and the first inverse signal 308 are substantially complementary to each other even if the first selection signal 306 and the first inverse signal 308 are both enabled or disabled for short durations of time (e.g., the first and second durations $T_A$ and $T_B$ that are less than the threshold duration length).

Figures 7A, 7B:
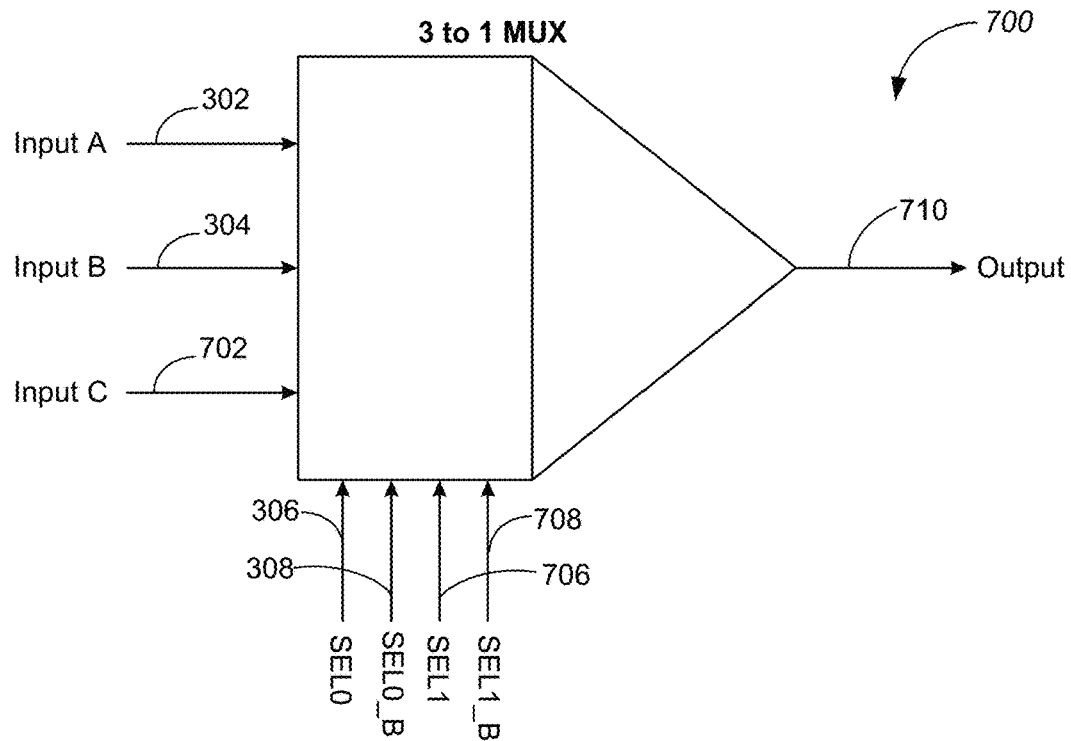
FIG. 7A is a symbolic diagram of an example three-input (3:1) multiplexer, in accordance with some embodiments.
FIG. 7B is a truth table of the three-input multiplexer shown in FIG. 7A, in accordance with some embodiments.

FIG. 7A is a symbolic diagram of an example three-input (3:1) multiplexer 700, in accordance with some embodiments, and FIG. 7B is a truth table 720 of the 3:1 multiplexer 700 shown in FIG. 7A, in accordance with some embodiments. In some embodiments, the 3:1 multiplexer 700 is applied in three-level pulsed amplitude modulation (PAM-3), and three levels represented by 2 data bits are transmitted in each sampling cycle. In some embodiments, a floating voltage states occurs with outputs of multiplexer branches of the multiplexer 700 when all of the selection signals and corresponding inverse signals are disabled or enabled concurrently.

The 3:1 multiplexer 700 receives a first input signal 302, a second input signal 304, a third input signal 702, a first selection signal 306, a first inverse signal 308, a second selection signal 706, and a second inverse signal 708. The multiplexer 700 selects one of the first input signal 302, the second input signal 304, and the third input signal 702 as a multiplexed output signal 710 based on the first selection signal 306, the first inverse signal 308, the second selection signal 706, and the second inverse signal 708. Stated another way, the 3:1 multiplexer 700 is controlled by the first selection signal 306, the first inverse signal 308, the second selection signal 706, and the second inverse signal 708 to select one of the input signals 302, 304, and 702 and generate the multiplexed output signal 310 tracking the selected one of the first input signal 302, the second input signal 304, and the third input signal 702. In some embodiments, the multiplexed output signal 710 has a delay (e.g., ~0.3 ns) from the selected one of the first input signal 302, the second input signal 304, and the third input signal 702.

The first inverse signal 308 is substantially complementary and opposite to the first selection signal 306, so is the second inverse signal 708 to the second selection signal 706. In some embodiments, the second inverse signal 708 is substantially complementary and opposite to the second selection signal 706 at any time. Alternatively, in some embodiments, both the second inverse signal 708 and the second selection signal 706 are enabled for a plurality of third durations corresponding to a plurality of first switching edges of the second selection signal 706, and both the second inverse signal 708 and the second selection signal 706 are disabled for a plurality of fourth durations corresponding to a plurality of second switching edges of the second selection signal 706. Each of the third and fourth durations is less than a threshold duration length (e.g., 0.1 ns) when the second inverse signal 708 is substantially complementary to the second selection signal 706. In other words, the second selection signal 706 and the second inverse signal 708 are substantially complementary to each other even if the second selection signal 706 and the second inverse signal 708 are both enabled or disabled for short durations of time (e.g., the third and fourth durations that are less than the threshold duration length).

Referring to FIG. 7B, in some embodiments (722), the first and second selection signals 306 and 706 are disabled (i.e., "0") at the low supply voltage, and the first and second inverse signal 308 and 708 are enabled (i.e., "1") at the high supply voltage. The multiplexer 300 selects the first input signal 302 as the multiplexed output signal 310. In some embodiments (724), the first selection signal 306 is disabled (i.e., "0") at the low supply voltage, and the first inverse signal 308 is enabled (i.e., "1") at the high supply voltage. The second selection signal 706 is enabled (i.e., "1") at the high supply voltage, and the second inverse signal 708 is disabled (i.e., "0") at the low supply voltage. The multiplexer 300 selects the second input signal 304 as the multiplexed output signal 310. Additionally, in some embodiments (726), the first and second selection signals 306 and 706 are enabled (i.e., "1") at the high supply voltage, and the first and second inverse signal 308 and 708 are disabled (i.e., "0") at the low supply voltage. The multiplexer 700 selects the third input signal 702 as the multiplexed output signal 710. Additionally and alternatively, in some embodiments (not shown), the first selection signal 306 is enabled (i.e., "1") at the high supply voltage, and the first inverse signal 308 is disabled (i.e., "0") at the low supply voltage. The multiplexer 700 selects the third input signal 702 as the multiplexed output signal 710, independently of the second selection signal 706 and the second inverse signal 708.

In some embodiments (728), all of the selection signals 306 and 706 and the inverse signals 308 and 708 are enabled (i.e., "1") at the high supply voltage, one or more nodes of the multiplexer 700 float and are not electrically coupled to any power supply by a current path, which may cause a startup or function failure in the multiplexer 700. In some embodiments (730), all of the selection signals 306 and 706 and the inverse signals 308 and 708 are disabled (i.e., "0") at the low supply voltage, and one or more nodes of the multiplexer 700 float and are not electrically coupled to any power supply by a current path, which may cause a startup or function failure in the multiplexer 700.

Figure 8:
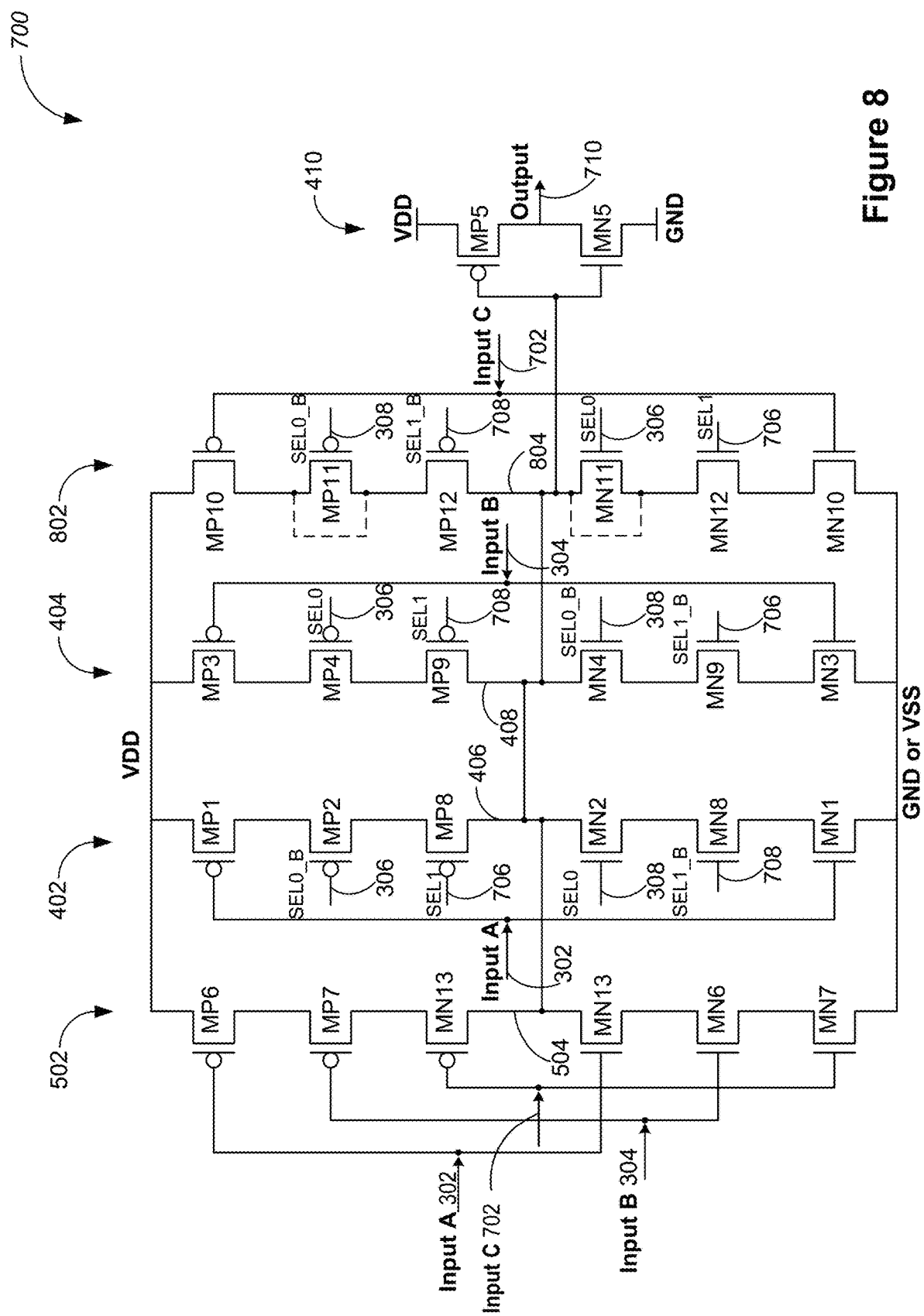
FIG. 8 is a circuit diagram of a three-input multiplexer, in accordance with some embodiments.

FIG. 8 is a circuit diagram of a three-input (3:1) multiplexer 700, in accordance with some embodiments. The 3:1 multiplexer 700 includes three multiplexer branches 402, 404, and 802 and an output interface 410. The three multiplexer branches includes a first multiplexer branch 402, a second multiplexer branch 404, and a third multiplexer branch 802. The first multiplexer branch 402 is configured to generate a first output signal 406 from a first selection signal 306 (SEL0), a first inverse signal 308 (SEL0_B), a second selection signal 706 (SEL1), a second inverse signal 708 (SEL1_B), and a first input signal 302 (Input A). The first inverse signal 308 is substantially complementary to the first selection signal 306, and the second inverse signal 708 is substantially complementary to the second selection signal 706. The second multiplexer branch 404 is configured to generate a second output signal 408 from the first selection signal 306 (SEL0), the first inverse signal 308 (SEL0_B), the second selection signal 706 (SEL1), the second inverse signal 708 (SEL1_B), and a second input signal 304 (Input B). In some embodiments, the third multiplexer branch 802 is configured to generate a third output signal 804 from the first selection signal 306 (SEL0), the first inverse signal 308 (SEL0_B), the second selection signal 706 (SEL1), the second inverse signal 708 (SEL1_B), and a third input signal 702 (Input C). Alternatively, in some embodiments, the third multiplexer branch 802 is configured to generate a third output signal 804 from the second selection signal 706 (SEL1), the second inverse signal 708 (SEL1_B), and a third input signal 702 (Input C). The output interface 410 is coupled to outputs of the three multiplexer branches 402, 404, and 802 and configured to generate a multiplexed output signal 710 tracking one of the first input signal 302, the second input signal 304, and the third input signal 702.

In addition to the three multiplexer branches 402, 404, and 802 and the output interface 410, the multiplexer 700 includes a modulation circuit 502. The modulation circuit 502 is configured to generate a logic output signal 504 from the first input signal 302, the second input signal 304, and the third input signal 702, independently of the selection signals 306 and 706 and the inverse signals 308 and 708. The output interface 410 is also coupled to an output of the modulation circuit 502 in addition to the outputs of the first multiplexer branch 402, the second multiplexer branch 404, and the third multiplexer branch 802. The output interface 410 is configured to generate the multiplexed output signal 710 tracking one of the first input signal 302, the second input signal 304, and the third input signal 702 based on the first output signal 406, the second output signal 408, the third output signal 804, and the logic output signal 504. Stated another way, an input of the output interface 410 is shorted to the outputs of the first multiplexer branch 402, second multiplexer branch 404, third multiplexer branch 802, and modulation circuit 502. In some embodiments, the multiplexed output signal 710 has a delay (e.g., ~0.3 ns) from the one of the first input signal 302, the second input signal 304, and the third input signal 702.

In some embodiments, the first multiplexer branch 402 includes a plurality of P-type transistors (e.g., MP1, MP2, MP8) and a plurality of N-type transistors (e.g., MN1, MN2, MP8), and the plurality of P-type transistors and the plurality of N-type transistors of the first multiplexer branch 402 are coupled in series and between two distinct power supplies (e.g., VDD and GND). Specifically, in an example, the first input signal 302 is coupled to a gate of a first one of the plurality of P-type transistors and a gate of a first one of the plurality of N-type transistors. The first selection signal 306 and the first inverse signal 308 are coupled to a gate of a second one of the plurality of P-type transistors and a gate of a second one of the plurality of N-type transistors, respectively. The second selection signal 706 and the second inverse signal 708 are coupled to a gate of a third one of the plurality of P-type transistors and a gate of a third one of the plurality of N-type transistors, respectively.

The second multiplexer branch 404 includes a plurality of P-type transistors (e.g., MP3, MP4, MP9) and a plurality of N-type transistors (e.g., MN3, MN4, MN9), and the plurality of P-type transistors and the plurality of N-type transistors of the second multiplexer branch 404 are coupled in series and between the two distinct power supplies (e.g., VDD and GND), i.e., in parallel with the first multiplexer branch 402.

Further, the third multiplexer branch 802 includes a plurality of P-type transistors (e.g., MP10, MP11, MP12) and a plurality of N-type transistors (e.g., MN10, MN11, MN12), and the plurality of P-type transistors and the plurality of N-type transistors of the third multiplexer branch 802 are coupled in series and between the two distinct power supplies (e.g., VDD and GND), i.e., in parallel with the first and second multiplexer branches 402 and 404. In some embodiments, all of the selection signals 306 and 706 and the inverse signals 308 and 708 are used to select each of the first, second, and third input signals 302, 304, and 702. Alternatively, in some embodiments, only the second selection signal SEL1 and second inverse signal SEL1_B are applied to select the third input signal 702, while all of the selection signals SEL0 and SEL1 and the inverse signals SEL0_B and SEL1_B are used to select the first and second input signals 302 and 304.

Referring to FIG. 8, in some situations, the selection signals 306 and 706 and the inverse signal 308 and 708 are disabled at a low supply voltage (i.e., set at "0") concurrently. The N-type transistors MN2, MN4, MN8, MN9, MN11, and MN12 are turned off, and current paths connecting outputs of the three multiplexer branches 402, 404, and 802 to the low power supply (e.g., GND) are disabled, independently of the input signals 302, 304, and 702. The P-type transistors MP2, MP4, MP8, MP9, MP11, and MP12 are turned on. If the first input signal 302, the second input signal 304, and the third input signal 702 are enabled at a high supply voltage (i.e., set to 37 1"), current paths connecting the outputs of the three multiplexer branches 402, 404, and 802 to the high power supply (e.g., VDD) are disabled, potentially causing the outputs of the three multiplexer branches 402, 404, and 802 to float. Alternatively, in some situations, the selection signals 306 and 706 and the inverse signal 308 and 708 are enabled at the high supply voltage (i.e., set at "1"). The P-type transistors MP2, MP4, MP8, MP9, MP11, and MP12 are turned off, and current paths connecting the outputs of the three multiplexer branches 402, 404, and 802 to the high power supply (e.g., VDD) are disabled, independently of the input signals 302, 304, and 702. The N-type transistors MN2, MN4, MN8, MN9, MN11, and MN12 are turned on. If the input signals 302, 304, and 702 are disabled at the low supply voltage (i.e., set to "0"), current paths connecting the outputs of the three multiplexer branches 402, 404, and 802 to the low power supply (e.g., VSS) are disabled, potentially causing the outputs of the three multiplexer branches 402, 404, and 802 to float. In the absence of the modulation circuit 502, the multiplexer 700 enters floating voltage states, potentially causing a circuit startup or function failure, (1) when the selection signals 306 and 706 and inverse signals 308 and 708 are disabled and the input signals 302, 304, and 702 are enabled or (2) when the selection signals 306 and 706 and inverse signals 308 and 708 are enabled and the input signals 302, 304, and 702 are disabled.

The modulation circuit 502 is configured to hold the input of the output interface to the logic output signal 504, when the input signals 302, 304, and 702 are all enabled or all disabled. Particularly, in some situations, all of the inverse signals 308 and 708 and the selection signals 306 and 706 are enabled concurrently, and a floating voltage state occurs to the three multiplexer branches 402, 404, and 802 if the input signals 302, 304, and 702 are all disabled. If the input signals 302, 304, and 702 are all disabled, P-type transistors MP6, MP7, and MP13 of the modulation circuit 502 are turned on to provide a current path to the high power supply (e.g., VDD), thereby suppressing the floating voltage state of the multiplexer 300. Conversely in some situations, all of the inverse signals 308 and 708 and the selection signals 306 and 70 are disabled, and the floating voltage state also occurs to the three multiplexer branches 402, 404, and 802 if the input signals 302, 304, and 702 are all enabled. If the input signals 302, 304, and 702 are enabled, N-type transistors MN6, MN7, and MN13 of the modulation circuit 502 are turned on to provide a current path to the low power supply (e.g., GND), thereby suppressing the floating voltage state of the multiplexer 700. In other words, the modulation circuit 502 is configured to provide a current path, coupling an input of the output interface 410 to (1) a first supply voltage (e.g., VDD), when all of the inverse signals 308 and 708 and the selection signals 306 and 706 are enabled and when the input signals 302, 304, and 702 are disabled; or (2) a second supply voltage (e.g., GND), when all of the inverse signals 308 and 708 and the selection signals 306 and 706 are disabled and when the input signals 302, 304, and 702 are enabled.

Alternatively, in some situations, when the input signals 302, 304, and 702 are all enabled or all disabled, the first inverse signal 308 and the first selection signal 306 are opposite, and the second inverse signal 708 and the second selection signal 706 are opposite. The logic output signal 504 is consistent with the selected one of the input signals 302, 304, and 702. Additionally, in some situations, if one signal of the input signals 302, 304, and 702 is enabled and the other two signals are disabled, a corresponding one of the three multiplexer branches 402, 404, and 802 provides a current path to a high or low power supply to the input of the output interface 410. The floating voltage state does not occur to the three multiplexer branches 402, 404, and 802, while the output of the modulation circuit 502 is floating.

Referring to FIG. 8, in some embodiments, the modulation circuit 502 of the 3:1 multiplexer includes a plurality of transistors coupled in series between the high supply voltage and the low supply voltage. The plurality of transistors include three N-type transistor MN6, MN7, and MP13 and three P-type transistors MP6, MP7, and MP13. Each of the input signals 302, 304, and 702 is coupled to a gate of a distinct P-type transistor and a distinct N-type transistor of the modulation circuit 502. For each input signal 302, 304, or 702, a relative position of the distinct P-type transistor in the plurality of P-type transistors is selected independently of a relative position of the distinct N-type transistor in the plurality of N-type transistors in the respective multiplexer branch 402, 404, or 802.

The modulation circuit 502 generates the logic output signal 504 based on the input signals 302, 304, and 702, independently of the selection signals 306 and 706 and the inverse signals 308 and 708. The modulation circuit 502 prepares the logic output voltage 504 concurrently with, or in advance of, operation of the three multiplexer branches 402, 404, and 802 to anticipate the floating voltage state of the three multiplexer branches 402, 404, and 802, while not disturbing performance of the multiplexer 700 when the floating voltage state does not occur to the three multiplexer branches 402, 404, and 802. By these means, the modulation circuit 502 does not wait for the first output signal 406, the second output signal 408, the third output signal 804 or the multiplexed output signal 310 to be available for detection of the floating voltage state, and offers an effective solution to suppress the floating voltage state in a high speed communication link (e.g., in a DFE 244 (FIG. 2), where the selection signals 306 and 706 have frequencies that are greater than a threshold frequency).

Figure 9:
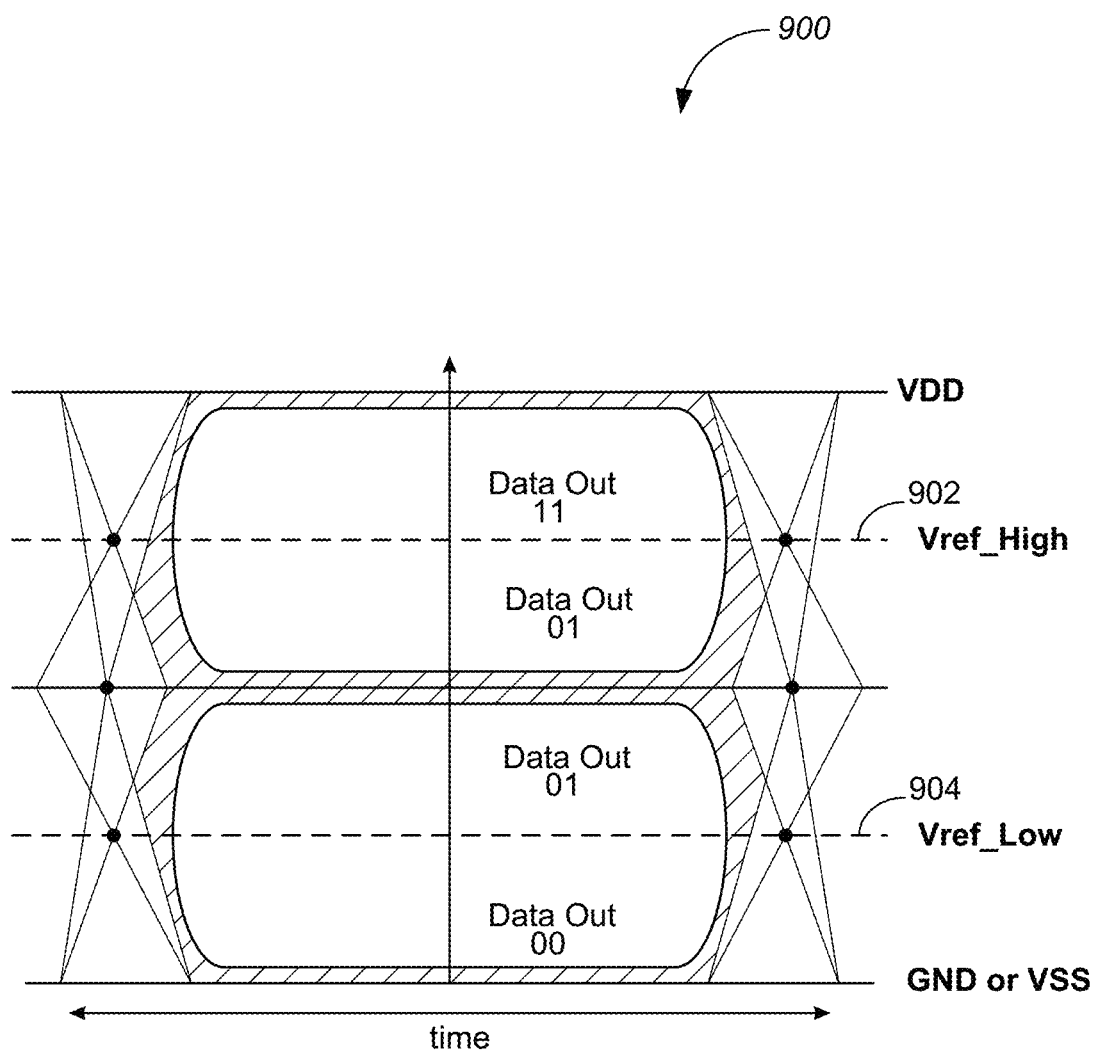
FIG. 9 is an eye diagram of an example input signal in a three-level pulsed amplitude modulation (PAM-3) system, in accordance with some embodiments.

FIG. 9 is an eye diagram 900 of an example input signal Vin in a PAM-3 system, in accordance with some embodiments. In PAM-3, three levels defined by 2 data bits are transmitted in each sampling cycle. A first reference voltage 902 (Vref_High) is lower than a high supply voltage (e.g., 1.5V) of a first power supply (e.g., VDD) and higher than a second reference voltage 904. The second reference voltage 904 (Vref_Low) is higher than a low supply voltage (e.g., 0V, −1.5V) of a second power supply (e.g., GND, VSS). In some embodiments, the first reference voltage 902 is higher than an average of the high and low supply voltages, and the second reference voltage 904 is lower than the average of the high and low supply voltages. In accordance with a determination that the input signal Vin is higher than the first reference voltage 902, a PAM-3 system provides output data is a first two-bit data item (e.g., "11"). In accordance with a determination that the input signal Vin is lower than the second reference voltage 904, the PAM-3 system provides output data is a second two-bit data item (e.g., "00"). In accordance with a determination that the input signal Vin is between the first and second reference voltages 902 and 904, the PAM-3 system provides output data is a third two-bit data item (e.g., "01", "10").

In some embodiments, two slice circuits generate a two-bit data item of the output data with reference to the first reference voltage 902 and the second reference voltage 904. The two-bit data item of the output data is further used to provide the first selection signal 306 and the second selection signal 706 for selecting one of the input signals 302, 304, and 702.

It is noted that in some embodiments, a multi-input multiplexer includes an integer number M of multiplexer branches for selecting one of the integer number M of input signals, where M is equal to 2, 3, 4, or above. The multi-input multiplexer is used with M-level pulsed amplitude modulation in which the integer number M of different voltage levels are transmitted in each sampling cycle. A modulation circuit 502 is configured to combine the integer number M of input signals to address a floating voltage state issue of such a multi-input multiplexer, particularly in a high speed communication link (e.g., in a DFE 244 (FIG. 2), where the selection signals 306 and 706 have frequencies that are greater than a threshold frequency).

Figure 10:
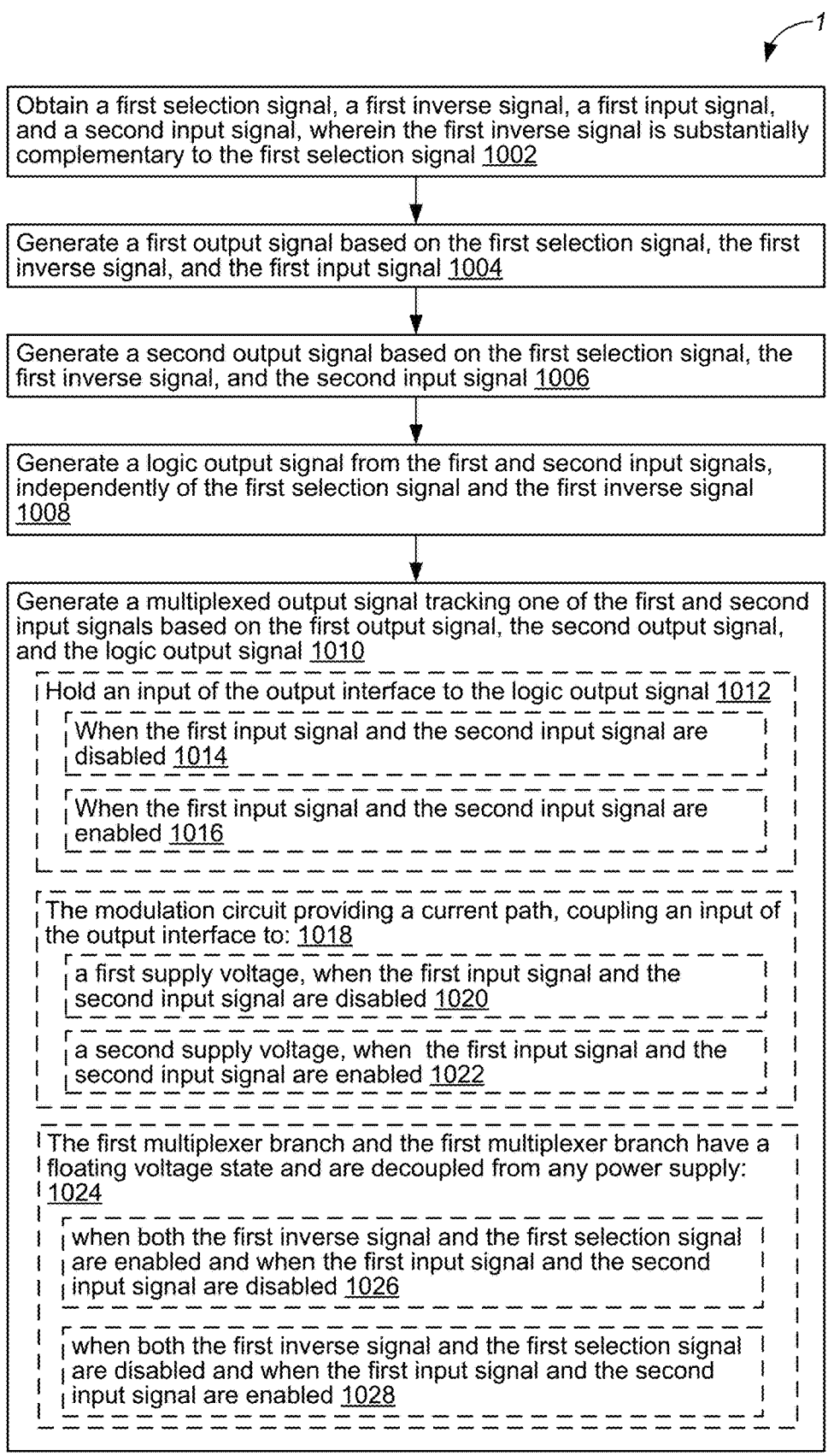
FIG. 10 is a flow diagram of an example method for multiplexing input signals, in accordance with some embodiments.

FIG. 10 is a flow diagram of an example method 1000 for multiplexing input signals, in accordance with some embodiments. The method 1000 is implemented by an electronic device. The electronic device obtains (1002) a first selection signal 306, a first inverse signal 308, a first input signal 302, and a second input signal 304. The first inverse signal 308 is substantially complementary to the first selection signal 306. A first multiplexer branch 402 (FIG. 4) generates (1004) a first output signal 406 based on the first selection signal 306, the first inverse signal 308, and the first input signal 302. A second multiplexer branch 404 (FIG. 4) generates (1006) a second output signal 408 based on the first selection signal 306, the first inverse signal 308, and the second input signal 304. A modulation circuit 502 (FIG. 5) generates (1008) a logic output signal 504 from the first and second input signals 302 and 304, independently of the first selection signal 306 and the first inverse signal 308. The electronic device generates (1010) a multiplexed output signal tracking one of the first and second input signals 302 and 304 based on the first output signal 406, the second output signal 408, and the logic output signal 504 via an output interface 410.

In some embodiments, the modulation circuit 502 holds (1012) an input of the output interface 410 to the logic output signal 504, when the first input signal 302 and the second input signal 304 are disabled (1014) or when the first input signal 302 and the second input signal 304 are enabled (1016).

In some embodiments, the modulation circuit 502 provides (1018) a current path, coupling an input of the output interface 410 to a first supply voltage when the first input signal 302 and the second input signal 304 are disabled (1020) or to a second supply voltage when both the first inverse signal 308 and the first selection signal 306 are disabled and when the first input signal 302 and the second input signal 304 are enabled (1022).

In some embodiments, the modulation circuit provides a current path to outputs of the first multiplexer branch 402 and the second multiplexer branch 404, (1) when both the first inverse signal 308 and the first selection signal 306 are enabled and when the first input signal 302 and the second input signal 304 are disabled (1024); or (2) when both the first inverse signal 308 and the first selection signal 306 are disabled and when the first input signal 302 and the second input signal 304 are enabled (1026). Otherwise, in the absence of the modulation circuit 502, a respective output of each of the first multiplexer branch 402 and the second multiplexer branch 404 has a floating voltage state and is electrically decoupled from any power supply.

In some embodiments, an input of the output interface 410, an output of the first multiplexer branch 402, an output of the second multiplexer branch 404, and an output of the modulation circuit 502 are shorted to one another.

In some embodiments, the first output signal 406 tracks the first input signal 302 when the first selection signal 306 is enabled and the first inverse signal 308 is disabled. The second output signal 408 tracks the second input signal 304 when the first selection signal 306 is disabled and the first inverse signal 308 is enabled.

In some embodiments, both the first inverse signal 308 and the first selection signal 306 are enabled for a plurality of first durations $T_A$ (FIG. 6B), and both the first inverse signal 308 and the first selection signal 306 are disabled for a plurality of second durations $T_B$ (FIG. 6B). Each of the first and second durations is less than a threshold duration length when the first inverse signal 308 is substantially complementary to the first selection signal 306.

In some embodiments, the modulation circuit 502 includes a plurality of transistors coupled in series between a high supply voltage and a low supply voltage, and the plurality of transistors include a first N-type transistor MN6, a second N-type transistor MN7, a first P-type transistor MP6, and a second P-type transistor MP6 (FIG. 5). The first input signal 302 is coupled to gates of the first P-type transistor MP6 and the first N-type transistor MN6, and the second input signal 304 is coupled to gates of the second P-type transistor MP7 and the second N-type transistor MN7. Further, in some embodiments, the first P-type transistor MP6 is coupled between the second P-type transistor MP7 and the high supply voltage (e.g., VDD), and the first N-type transistor MN6 is coupled between the second N-type transistor MN7 and the low supply voltage (e.g., VSS). Alternatively, in some embodiments, the first P-type transistor MP6 is coupled between the second P-type transistor MP7 and the high supply voltage, and the second N-type transistor MN7 is coupled between the first N-type transistor MN6 and the low supply voltage (FIG. 5).

In some embodiments, the first selection signal 306 has a frequency that is greater than a threshold frequency.

In some embodiments, the first multiplexer branch 402 includes a plurality of P-type transistors and a plurality of N-type transistors, and the plurality of P-type transistors and the plurality of N-type transistors are coupled in series and between two distinct supply voltages. The first input signal 302 is coupled to a gate of a first P-type transistor MP1 and a gate of a first N-type transistor MN1. The first selection signal 306 and the first inverse signal 308 are coupled to a gate of a second N-type transistor MN2 and a gate of a second P-type transistor MP2, respectively (FIG. 5).

In some embodiments, the output interface 410) includes a complementary metal-oxide semiconductor (CMOS) inverter including an output P-type transistor MP5 and an output N-type transistor MN5 (FIG. 5). An output of the CMOS inverter is configured to output the multiplexed output signal 310 tracking the one of the first and second input signals 302 and 304. An input of the CMOS inverter is coupled to outputs of the first multiplexer branch 402, the second multiplexer branch 404, and the modulation circuit 502.

Figure 11:
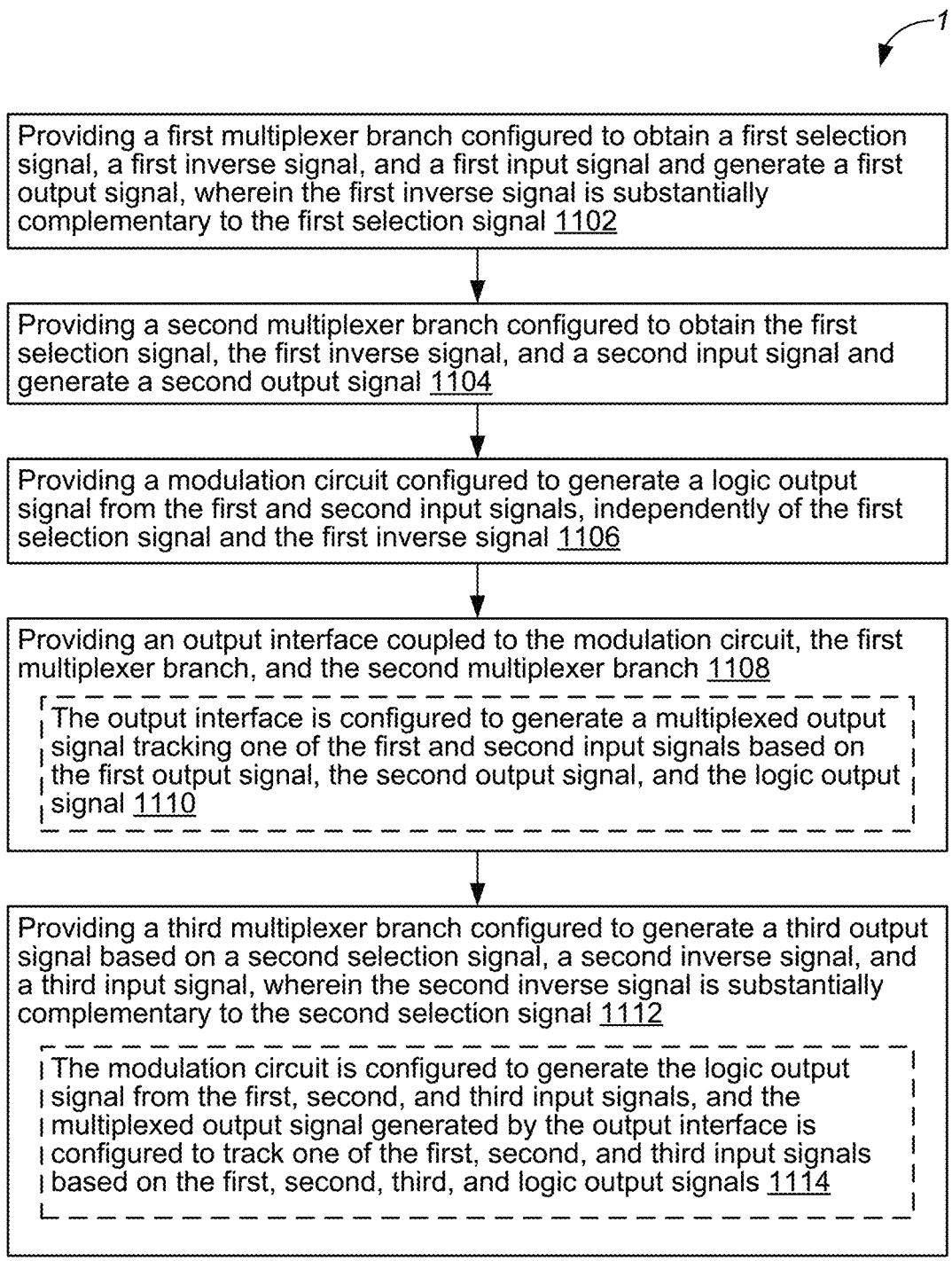
FIG. 11 is a flow diagram of an example method for providing a multiplexer in which a modulation circuit is applied to control or suppress floating voltage states, in accordance with some embodiments.

FIG. 11 is a flow diagram of an example method 1100 for providing a multiplexer 300 in which a modulation circuit 502 is applied to control or suppress a floating voltage state, in accordance with some embodiments. The method 1100 includes providing (1102) a first multiplexer branch configured to obtain a first selection signal 306, a first inverse signal 308, and a first input signal 302 and generate a first output signal 406. The first inverse signal 308 is substantially complementary to the first selection signal 306. The method 1100 further includes providing (1104) a second multiplexer branch configured to obtain the first selection signal 306, the first inverse signal 308, and a second input signal 304 and generate a second output signal 408. The method 1100 further includes providing (1106) a modulation circuit 502 configured to generate a logic output signal 504 from the first and second input signals 302 and 304, independently of the first selection signal 306 and the first inverse signal 308. The method 1100 further includes providing (1108) an output interface 410 coupled to the modulation circuit 502, the first multiplexer branch, and the second multiplexer branch. The output interface 410 is configured to generate (1110) a multiplexed output signal tracking one of the first and second input signals 302 and 304 based on the first output signal 406, the second output signal 408, and the logic output signal 504.

In some embodiments, the method 1100 further includes providing (1112) a third multiplexer branch 802 (FIG. 8) configured to generate a third output signal 804 based on a second selection signal 706, a second inverse signal 708, and a third input signal 702. The second inverse signal 708 is substantially complementary to the second selection signal 706. The modulation circuit 502 is configured (1114) to generate the logic output signal 504 from the first, second, and third input signals 302, 304, and 702, and the multiplexed output signal generated by the output interface 410 is configured to track one of the first, second, and third input signals 302, 304, and 702 based on the first, second, third, and logic output signals 406, 408, 804, and 504. Further, in some embodiments, the third output signal 804 is generated based on the third input signal 702 when the second selection signal 706 is enabled and the second inverse signal 708 is disabled. Additionally. In some embodiments, the first output signal 406 depends on the first input signal 302 when the second selection signal 706 is disabled and the second inverse signal 708 is enabled, and the second output signal 408 depends on the second input signal 304 when the second selection signal 706 is disabled and the second inverse signal 708 is enabled.

In some embodiments (FIG. 8), the third multiplexer branch 802 is configured to generate the third output signal 804 based on the first selection signal 306 and the first inverse signal 308 in addition to the second selection signal 706, the second inverse signal 708, and the third input signal 702.

In some embodiments, the modulation circuit 502 is configured to, when the first input signal 302, the second input signal 304, and the third input signal 702 are all enabled or all disabled, hold an input of the output interface 410 to the logic output signal 504 and provide a current path coupling the input of the output interface 410 to at least one power supply (e.g., VDD, GND).

In some embodiments, the modulation circuit provides a current path to outputs of the first multiplexer branch 402, the second multiplexer branch 404, and the third multiplexer branch 802, (1) when the first inverse signal 308, the first selection signal 306, the second inverse signal 708 and the second selection signal 706 are enabled and when the first input signal 302, the second input signal 304, and the third input signal 702 are disabled, or (2) when the first inverse signal 308, the first selection signal 306, the second inverse signal 708 and the second selection signal 706 are disabled and when the first input signal 302, the second input signal 304, and the third input signal 702 are enabled. Otherwise, in the absence of the modulation circuit 502, a respective output of each of the first multiplexer branch 402, the second multiplexer branch 404, and the third multiplexer branch 802 has a floating voltage state and is electrically decoupled from any power supply.

In some embodiments, the methods 1000 and 1100 are, optionally, governed by instructions that are stored in a non-transitory computer readable storage medium and that are executed by one or more processors (e.g., a controller) of an electronic device (e.g., a driver device). Each of the operations shown in FIGS. 10 and 11 may correspond to instructions stored in a memory or non-transitory computer readable storage medium. The computer readable storage medium may include a magnetic or optical disk storage device, solid state storage devices such as Flash memory, or other non-volatile memory device or devices. The instructions stored on the computer readable storage medium may include one or more of: source code, assembly language code, object code, or other instruction format that is interpreted by one or more processors. Some operations in methods 1000 and 1100 may be combined and/or the order of some operations may be changed.

It should be understood that the particular order in which the operations in FIGS. 10 and 11 have been described are merely exemplary and are not intended to indicate that the described order is the only order in which the operations could be performed. One of ordinary skill in the art would recognize various ways to multiplexing signals while suppressing a floating voltage state as described herein. Additionally, it should be noted that details of other processes and structures described above with respect to FIGS. 1-9 are also applicable in an analogous manner to methods 1000 and 1100 described above with respect to FIGS. 10 and 11. For brevity, these details are not repeated here.

It will also be understood that, although the terms first, second, etc. are, in some instances, used herein to describe various elements, these elements should not be limited by these terms. These terms are only used to distinguish one element from another. For example, a first electronic device can be termed a second electronic device, and, similarly, a second electronic device can be termed a first electronic device, without departing from the scope of the various described embodiments. The first electronic device and the second electronic device are both electronic device, but they are not the same electronic device.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The above description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electronic device, comprising:
a first multiplexer branch configured to generate a first output signal from a first selection signal, a first inverse signal, and a first input signal, wherein the first inverse signal is substantially complementary to the first selection signal;
a second multiplexer branch configured to generate a second output signal from the first selection signal, the first inverse signal, and a second input signal;
a modulation circuit configured to generate a logic output signal from the first input signal and the second input signal, independently of the first selection signal and the first inverse signal; and an output interface coupled to the modulation circuit, the first multiplexer branch, and the second multiplexer branch, wherein the output interface is configured to generate a multiplexed output signal tracking one of the first input signal and the second input signal based on the first output signal, the second output signal, and the logic output signal.

2. The electronic device of claim 1, wherein the modulation circuit is configured to hold an input of the output interface to the logic output signal, when the first input signal and the second input signal are disabled or when the first input signal and the second input signal are enabled.

3. The electronic device of claim 1, wherein the modulation circuit is configured to provide a current path, coupling an input of the output interface to a first supply voltage when the first input signal and the second input signal are disabled or to a second supply voltage when the first input signal and the second input signal are enabled.

4. The electronic device of claim 1, wherein the modulation circuit provides a current path to outputs of the first multiplexer branch and the first multiplexer branch, (1) when both the first inverse signal and the first selection signal are enabled and when the first input signal and the second input signal are disabled; or (2) when both the first inverse signal and the first selection signal are disabled and when the first input signal and the second input signal are enabled.

5. The electronic device of claim 1, wherein an input of the output interface, an output of the first multiplexer branch, an output of the second multiplexer branch, and an output of the modulation circuit are shorted to one another.

6. The electronic device of claim 1, wherein:
the first output signal tracks the first input signal when the first selection signal is enabled and the first inverse signal is disabled; and
the second output signal tracks the second input signal when the first selection signal is disabled and the first inverse signal is enabled.

7. The electronic device of claim 1, wherein:
both the first inverse signal and the first selection signal are enabled for a plurality of first durations, and both the first inverse signal and the first selection signal are disabled for a plurality of second durations; and
each of the first and second durations is less than a threshold duration length when the first inverse signal is substantially complementary to the first selection signal.

8. The electronic device of claim 1, wherein:
the modulation circuit includes a plurality of transistors coupled in series between a high supply voltage and a low supply voltage, and the plurality of transistors include a first N-type transistor, a second N-type transistor, a first P-type transistor, and a second P-type transistor; and
the first input signal is coupled to gates of the first P-type transistor and the first N-type transistor, and the second input signal is coupled to gates of the second P-type transistor and the second N-type transistor.

9. The electronic device of claim 8, wherein the first P-type transistor is coupled between the second P-type transistor and the high supply voltage, and the first N-type transistor is coupled between the second N-type transistor and the low supply voltage.

10. The electronic device of claim 8, wherein the first P-type transistor is coupled between the second P-type transistor and the high supply voltage, and the second N-type transistor is coupled between the first N-type transistor and the low supply voltage.

11. The electronic device of claim 1, wherein the first selection signal has a frequency that is greater than a threshold frequency.

12. The electronic device of claim 1, wherein:
the first multiplexer branch includes a plurality of P-type transistors and a plurality of N-type transistors, and the plurality of P-type transistors and the plurality of N-type transistors are coupled in series and between two distinct supply voltages;
the first input signal is coupled to a gate of a first P-type transistor and a gate of a first N-type transistor; and
the first selection signal and the first inverse signal are coupled to a gate of a second N-type transistor and a gate of a second P-type transistor, respectively.

13. The electronic device of claim 1, wherein:
the output interface includes a complementary metal-oxide semiconductor (CMOS) inverter including an output P-type transistor and an output N-type transistor;
an output of the CMOS inverter is configured to output the multiplexed output signal tracking the one of the first and second input signals; and
an input of the CMOS inverter is coupled to outputs of the first multiplexer branch, the second multiplexer branch, and the modulation circuit.

14. The electronic device of claim 1, further comprising:
a third multiplexer branch configured to generate a third output signal based on a second selection signal, a second inverse signal, and a third input signal, wherein the second inverse signal is substantially complementary to the second selection signal;
wherein the modulation circuit is configured to generate the logic output signal from the first, second, and third input signals, and the multiplexed output signal generated by the output interface is configured to track one of the first, second, and third input signals based on the first, second, third, and logic output signals.

15. The electronic device of claim 14, wherein the third output signal is generated based on the third input signal when the second selection signal is enabled and the second inverse signal is disabled.

16. The electronic device of claim 15, wherein the first output signal depends on the first input signal when the second selection signal is disabled and the second inverse signal is enabled, and the second output signal depends on the second input signal when the second selection signal is disabled and the second inverse signal is enabled.

17. The electronic device of claim 14, wherein the third multiplexer branch is configured to generate the third output signal based on the first selection signal and the first inverse signal in addition to the second selection signal, the second inverse signal, and the third input signal.

18. The electronic device of claim 14, wherein the modulation circuit is configured to, when the first input signal, the second input signal, and the third input signal are all enabled or all disabled, hold an input of the output interface to the logic output signal and provide a current path coupling the input of the output interface to at least one power supply.

19. The electronic device of claim 18, wherein the modulation circuit provides a current path to outputs of the first multiplexer branch, the second multiplexer branch, and the third multiplexer branch, (1) when the first inverse signal, the first selection signal, the second inverse signal and the second selection signal are enabled and when the first input signal, the second input signal, and the third input signal are disabled, or (1) when the first inverse signal, the first selection signal, the second inverse signal and the second selection signal are disabled and when the first input signal, the second input signal, and the third input signal are enabled.

20. A method for multiplexing input signals, comprising:
- obtaining a first selection signal, a first inverse signal, a first input signal, and a second input signal, wherein the first inverse signal is substantially complementary to the first selection signal;
- generating a first output signal based on the first selection signal, the first inverse signal, and the first input signal;
- generating a second output signal based on the first selection signal, the first inverse signal, and the second input signal;
- generating a logic output signal from the first and second input signals, independently of the first selection signal and the first inverse signal; and
- generating a multiplexed output signal tracking one of the first and second input signals based on the first output signal, the second output signal, and the logic output signal.

* * * * *